United States Patent
Kitakado

(10) Patent No.: US 8,421,944 B2
(45) Date of Patent: Apr. 16, 2013

(54) DISPLAY DEVICE SUBSTRATE, DISPLAY DEVICE, AND WIRING SUBSTRATE

(75) Inventor: Hidehito Kitakado, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 566 days.

(21) Appl. No.: 12/530,557

(22) PCT Filed: Dec. 19, 2007

(86) PCT No.: PCT/JP2007/074456
§ 371 (c)(1),
(2), (4) Date: Sep. 9, 2009

(87) PCT Pub. No.: WO2008/136158
PCT Pub. Date: Nov. 13, 2008

(65) Prior Publication Data
US 2010/0110320 A1    May 6, 2010

(30) Foreign Application Priority Data
Apr. 24, 2007 (JP) .................................. 2007-114543

(51) Int. Cl.
*G02F 1/136* (2006.01)
*H01L 31/112* (2006.01)

(52) U.S. Cl.
USPC ............................................ 349/47; 257/72

(58) Field of Classification Search .............. 349/47; 257/72
See application file for complete search history.

(56) References Cited

U.S. PATENT DOCUMENTS

| 5,182,620 | A | * | 1/1993 | Shimada et al. | 257/72 |
| 5,453,856 | A | | 9/1995 | Kim | |
| 6,067,132 | A | * | 5/2000 | Kim | 349/47 |
| 6,542,205 | B2 | * | 4/2003 | Ohtani et al. | 349/47 |
| 2002/0171086 | A1 | | 11/2002 | Miyajima et al. | |
| 2003/0128178 | A1 | * | 7/2003 | Murade | 345/87 |
| 2003/0160244 | A1 | * | 8/2003 | Amano et al. | 257/72 |
| 2005/0040531 | A1 | | 2/2005 | Kurokawa | |
| 2005/0140877 | A1 | * | 6/2005 | Jeoung et al. | 349/114 |
| 2006/0256251 | A1 | * | 11/2006 | Oh et al. | 349/43 |
| 2008/0129911 | A1 | * | 6/2008 | Huang et al. | 349/44 |
| 2009/0004846 | A1 | | 1/2009 | Kurokawa | |

FOREIGN PATENT DOCUMENTS

| CN | 1379276 A | 11/2002 |
| JP | 5-150264 A | 6/1993 |
| JP | 6-34996 A | 2/1994 |
| JP | 6-258670 A | 9/1994 |
| JP | 2002-297058 A | 10/2002 |
| JP | 2005-72573 A | 3/2005 |

* cited by examiner

*Primary Examiner* — Bumsuk Won
*Assistant Examiner* — Michael Inadomi
(74) *Attorney, Agent, or Firm* — Birch, Stewart, Kolasch & Birch, LLP

(57) ABSTRACT

The present invention provides a display device substrate, a display device, and a wiring substrate, each permitting more flexible wiring design and a reduction in area of wirings with suppressing wiring defects.

The present invention is a display device substrate including, on a main surface of a substrate, a structure of alternating layers of: a plurality of interlayer insulating films; and three or more wiring layers, wherein the display device substrate includes a data wiring, and the data wiring is positioned in a third or higher wiring layer from a side of the substrate.

2 Claims, 11 Drawing Sheets

DISPLAY DEVICE SUBSTRATE, DISPLAY DEVICE, AND WIRING SUBSTRATE

TECHNICAL FIELD

The present invention relates to a display device substrate, a display device, and a wiring substrate. More particularly, the present invention relates to a display device substrate and a display device, suitable for display devices such as a liquid crystal display device that permits flexible wiring design, and also relates to a wiring substrate suitable as one that causes less defects such as disconnection and patterning defect.

BACKGROUND ART

A liquid crystal display device is now being widely used as a display device including a display device substrate. The liquid crystal display device is used in various electrical devices because of its characteristics such as a small and slim profile, a low electrical power consumption, and light weight. Particularly, an active matrix liquid crystal display device having switching elements each arranged in a pixel is being widely used in OA apparatuses such as a PC, AV apparatuses such as a TV, mobile apparatuses such as a cellular phone, for example.

FIG. 12 is a schematic view showing a conventional display device substrate used in a liquid crystal display device. FIG. 12(a) is a plan view thereof. FIG. 12(b) is a cross-sectional view of the substrate taken along line X8-Y8 in FIG. 12(a). A conventional display device substrate 11 includes: on a main surface of a substrate 1110, a base layer 1111; pixel switching transistors 1113a and 1113b; gate electrodes 1119a and 1119b; a plurality of gate wirings 1118; a storage capacitor lower electrode 1122; a plurality of storage capacitor wirings (storage capacitor upper electrodes) 1121; a pixel date storage capacitor element 1120; a plurality of data wirings 1115; a first interlayer insulating film 1151 having contact holes 1154a and 1154b; a second interlayer insulating film 1152 having a through-hole 1155; a pixel electrode 1116; and a connection part 1117 for connecting the pixel electrode 1116 to a source-drain region of the transistor 1113b, as shown in FIG. 12.

The display device substrate 11 has, on the main surface of the substrate 1110, a structure where the base layer 1111, the semiconductor layer 1130, the gate insulating film 1112, the first wiring layer 1141, the first interlayer insulating film 1151, the second wiring layer 1142, the second interlayer insulating film 1152, and the pixel electrode 1116 are stacked in this order from the substrate 1110 side.

The pixel date storage capacitor element 1120 is composed of the storage capacitor lower electrode 1122 formed in the semiconductor layer and the storage capacitor wiring 1121 constituted by the first wiring layer 1141. That is, a region facing the storage capacitor lower electrode 1122 of the storage capacitor wiring 1121 functions as a storage capacitor upper electrode. The gate wiring 1118 is formed from a high melting point metal or polysilicon, with a high resistivity. The date wiring 1115 is arranged to cross with (perpendicular to) the gate wiring 1118 and the storage capacitor wiring 1121 and to be insulated with these wirings 1118 and 1121 by the first interlayer insulating film 1151. In addition, the first interlayer insulating film 1151 is formed from an inorganic insulating material including silicon (for example, SiO$_2$, SiN, SiNO) by plasma CVD, sputtering, and the like. The data wiring 1115 and the connection part 1117, which are positioned in the second wiring layer 1142, are formed by patterning a conductive layer formed on the first interlayer insulating film 1151 by photolithography.

For such a liquid crystal display device, improvements in characteristics such as an increase in resolution, improvements in ratio of a pixel effective area (high aperture ratio) and in display qualities, and a reduction in electrical power consumption, are needed.

Under such a circumstance, for example, Patent Document 1 discloses the following liquid crystal panel with build-in driver capable of fitting to fine pixel. The panel includes a matrix array and a driving circuit for driving this matrix array on the same transparent substrate. The matrix array includes a gate wiring that is electrically connected to a gate of a thin film transistor; and a first data wiring that is electrically connected to a source of the transistor through a connection hole of a lower interlayer insulating film; and a second data wiring that is electrically connected to the first data wiring surface and forms a multi-wiring layer structure. The driving circuit includes a three-wiring layer structure where the layers are separated from each other by the lower interlayer insulating film and the upper interlayer insulating film. At least one of the first and second data wirings is formed from the same material as a material for anyone of the wiring layers arranged in the driving circuit (for example, refer to Patent Document 1).

In addition, Patent Document 2 discloses the following driver built-in active matrix display panel which can improve a display grade by adopting a structure meeting functions for pixel regions and a driving circuit. In a pixel region partitioned by a scanning line that is electrically connected to a gate electrode of a thin film transistor and a signal line with a high etching resistance that is electrically connected to a source of the thin film transistor through a first connection hole that is formed on the surface side of a lower interlayer insulating film formed on the upper layer side of the scanning line and that penetrate the lower interlayer insulating film and a gate insulating film of the thin film transistor, the panel includes: an upper interlayer insulating film that is formed on the upper layer side of the signal line; and a pixel electrode being formed on the surface side of this upper interlayer insulating film such that an end of the pixel electrode is close to an upper position of a signal line partitioning the corresponding pixel region, the pixel electrode being electrically connected to a drain of the thin film transistor through a second connection hole that penetrates the upper interlayer insulating film, the lower interlayer insulating film, and the gate insulating film.

Like the display panels disclosed in Patent Documents 1 and 2, a peripheral circuit such as a driver may be integrally formed on a substrate constituting a display device. In addition to high-resolution, improvements in ratio of a pixel effective area (high aperture ratio) and in display qualities and a reduction in electrical power consumption, such a display device needs downsizing of the peripheral circuit. So a technology of forming a multi-layered wiring that is formed in a peripheral circuit is being researched and developed.

With respect to this multi-layered wiring technology, for example, Patent Document 3 discloses the following wiring substrate as a technology of providing a wiring substrate and a semiconductor device, each including a multi-layered wiring that can be formed through a smaller number of steps and having a small circuit with high functions. The wiring substrate includes: a first wiring formed on a substrate with an insulating surface; a first interlayer insulating film formed to cover the first wiring; a second wiring formed on the first interlayer insulating film; a second interlayer insulating film formed to cover the second wiring; a third wiring formed on the second interlayer insulating film; a first contact hole that is formed in the first interlayer insulating film and electrically connects the first wiring to the second wiring; a second contact hole that is formed in the second interlayer insulating film and electrically connects the second wiring to the third wiring, and the third wiring has a width larger than that of the first and second wirings, the second wiring has a width larger than that of the first wiring, and the second contact hole has a diameter or an area larger than that of the first contact hole.
[Patent Document 1]
Japanese Kokai Publication No. H-05-150264
[Patent Document 2]
Japanese Kokai Publication No. H-06-34996
[Patent Document 3]
Japanese Kokai Publication No. 2005-72573

DISCLOSURE OF INVENTION

In the conventional display device substrate 11 shown in FIG. 12, the first wiring layer 1141 is formed on the gate insulating film 1112 with a small thickness of 100 nm or less. At a portion where the gate insulating film 1112 covers an edge of the storage capacitor lower electrode 1122 and has a particularly small thickness, the withstand voltage of the gate insulating film 1112 is decreased in some cases. If the width of the gate wiring 1118 is decreased for the purpose of increasing an aperture ratio of pixels, wiring delay in the gate wiring 1118, which is formed from a high melting point metal or polysilicon with a high resistivity, might be generated. If the length of the gate wiring 1118 is increased along with an increase in panel size, wiring delay might be caused in the gate wiring 1118. The first interlayer insulating film 1151 is formed to have a relatively small thickness, and so a large capacitance is generated between the data wiring 1115, and the gate wiring 1118 and the storage capacitor wiring 1121. Display defects might be generated by writing deficiency of signal voltage, or the power consumption during panel driving might be increased. The first interlayer insulating film 1151 formed by CVD has an uneven surface. So a conductive layer for forming the data wiring 1115 and the connection part 1117 also has an uneven part. As a result, when the conductive layer is subjected to photolithography, the focal depth varies, which results in a variation in width of the data wiring 1115 and the connection 1117. In this case, the conductive layer might remain at the uneven part after being etched, and as a result, a short-circuit between the data wiring 1115 and/or the connection parts 1118 might be caused.

The technology in Patent Document 1 has room for improvement in the following points (1) to (4).
(1) The capacitance formed between the data wiring and the gate wiring is increased compared with the conventional display device substrate 11 shown in FIG. 12, and the electrical power consumption is increased. This is because charge and discharge current for driving the data wiring has the strongest influences on the power consumption of the panel.
(2) Similarly to the conventional display device substrate 11 shown in FIG. 12, polycrystalline silicon or a high melting point metal material is used for the gate wiring (gate electrode). So wiring delay might be generated in the gate wiring 1118.
(3) The second and third interlayer insulating films are formed by CVD and therefore have an uneven surface. As a result, similarly to the conventional display device substrate 11 shown in FIG. 12, the wirings might have various widths and/or a short-circuit between the wirings might be generated.
(4) The pixel electrode layer is directly connected to the second wiring layer with the second and third interlayer insulating films therebetween. In this connection region, the pixel electrode layer is disconnected, or a large depression of the connection part (connection hole) causes a variation in alignment of liquid crystals.

Thus, a display device including a conventional display device substrate has various problems on wirings. In order to solve these problems comprehensively, the design of wirings needs to be significantly changed, but in the conventional display device substrate, it is difficult to change the design any more.

The technology disclosed in Patent Document 2 discloses that two connection holes (the second and third connection holes) formed in two stacked interlayer insulating films, respectively, overlap with each other. As a result, the depth of the connection hole is doubled, and so patterning defects might be easily generated at the time of photolithography and etching, and coverage of the wiring might become insufficient. In addition, as a result of the insufficient coverage, disconnection of the wiring might tend to be generated.

According to the technology disclosed in Patent Document 3, a fine pattern can not be formed using the upper wirings. If this technology is applied to a pixel electrode, a layout area is increased, which reduces an aperture ratio.

In the conventional wiring substrate having such a multi-layered wiring, and the like, defects such as patterning defects, disconnection of wirings needs to be suppressed and the layout area of wirings needs to be reduced. In such points, there is room for improvement.

The present invention has been made in view of the above-mentioned state of the art. The present invention has an object to provide a display device substrate, a display device, and a wiring substrate, each permitting more flexible wiring design and a reduction in area of wirings with suppressing wiring defects.

The present inventors made various investigations on a display device substrate, a display device, and a wiring substrate, each permitting more flexible wiring design and a reduction in area of wirings with suppressing defects of a wiring layer. The inventors noted a technology forming a multi-layered wiring. Then the inventors found that wirings in a display device substrate can be more flexibly designed if a data wiring is constituted by the third or higher wiring layer from the substrate side. The inventors also found that interlayer insulating films for insulating the stacked wiring layers from each other are provided with connection holes in such a way that the connection holes overlap with each other in every other interlayer insulating film, and thereby disconnection and patterning defects of the wiring layer caused by the difference in level attributed to the connection hole are suppressed and the area of the wiring pattern can be decreased as much as possible. As a result, the above-mentioned problems have been admirably solved, leading to completion of the present invention.

That is, the present invention is a display device substrate including, on a main surface of a substrate, a structure of alternating layers of: a plurality of interlayer insulating films; and three or more wiring layers, wherein the display device substrate includes a data wiring, and the data wiring is positioned in a third or higher wiring layer from a side of the substrate. As a result, components such as a gate wiring, a storage capacitor wiring, and a storage capacitor electrode can be arranged in the first and second wiring layers from the substrate side. Accordingly, the wirings in the display device substrate can be more flexibly designed.

The configuration of the display device substrate of the present invention is not especially limited. The substrate may or may not include other components as long as such components are essentially included.

Preferable embodiments of the display device substrate according to the present invention are mentioned in more detail below. It should be understood that the following embodiments may be appropriately combined.

In order to suppress display defects in a display device and reduce electrical power consumption during display device driving, an embodiment (hereinafter, also referred to as a "first embodiment") in which the display device substrate includes a gate wiring and a storage capacitor wiring, at least one of the gate wiring and the storage capacitor wiring is positioned in at least one of first and second wiring layers from the side of the substrate is preferable, and an embodiment in which the display device substrate includes a gate wiring and a storage capacitor wiring, and the gate wiring and the storage capacitor wiring are positioned in at least one of the first and second wiring layers from the side of the substrate is more preferable.

In view of further reduction in electrical power consumption and higher-speed driving of the display device, in an embodiment including the first embodiment, it is preferable that in the display device substrate, a second interlayer insulating film that is arranged between the second wiring layer and the third wiring layer has a thickness larger than a thickness of a first interlayer insulating film that is arranged between the first wiring layer and the second wiring layer. The first interlayer insulating film preferably has a thickness of about 0.5 to 1.5 μm, and more preferably about 0.7 to 1.0 μm, and still more preferably about 0.8 μm. The second interlayer insulating film preferably has a thickness of about 1.0 to 3.0 μm and more preferably about 1.5 to 2.0 μm.

In order to suppress withstand voltage defects of the gate insulating film, it is preferable that the display device substrate has a structure in which a semiconductor layer, a gate insulating film arranged on the semiconductor layer, a first wiring layer arranged on the gate insulating film, a first interlayer insulating film arranged on the first wiring layer, and a second wiring layer arranged on the first interlayer insulating film are stacked in this order from the side of the substrate, the display device substrate includes a pixel data storage capacitor element in each pixel, the pixel data storage capacitor element in each pixel including: a storage capacitor lower electrode formed in the semiconductor layer; the gate insulating film; and a storage capacitor upper electrode that is positioned in the first wiring layer, in adjacent two pixels, the storage capacitor upper electrodes are connected to each other through a storage capacitor wiring that is positioned in the second wiring layer, and the storage capacitor upper electrode is arranged in a region overlapping with the storage capacitor lower electrode (a region of the storage capacitor lower electrode) when the main surface of the substrate is viewed in plane. From such viewpoints, the substrate may have the following embodiment: the display device substrate has a structure in which a semiconductor layer, a gate insulating film arranged on the semiconductor layer, a first wiring layer arranged on the gate insulating film, a first interlayer insulating film arranged on the first wiring layer, and a second wiring layer arranged on the first interlayer insulating film are stacked in this order from the side of the substrate, the display device substrate includes a plurality of pixel data storage capacitor elements in each pixel, each of the pixel data storage capacitor elements including: a storage capacitor lower electrode formed in the semiconductor layer; the gate insulating film; and a storage capacitor upper electrode that is positioned in the first wiring layer, in two pixels adjacent in an extending direction of the storage capacitor wiring that is positioned in the second wiring layer, the storage capacitor upper electrodes are connected to each other through the storage capacitor wiring, and in each pixel, the storage capacitor upper electrode is arranged in a region overlapping with the storage capacitor lower electrode (a region of the storage capacitor lower electrode) when the main surface of the substrate is viewed in plane.

In order to increase an aperture ratio and a screen size and to improve a gate signal delay, it is preferable that the display device substrate includes a gate wiring layer, and at least a portion of the gate wiring is positioned in a second wiring layer from the side of the substrate, and it is more preferable that the second wiring layer has a resistance lower than a resistance of a first wiring layer from the side of the substrate. In addition, the second wiring layer may have a melting point lower than that of the first wiring layer. From such a viewpoint, the display device substrate may have the following embodiment: the display device substrate includes a gate wiring, and the gate wiring includes a portion that is positioned in a second wiring layer from the side of the substrate. It is particularly preferable that the display device substrate includes a gate wiring, the gate wiring is composed of a portion that is positioned in the first wiring layer from the side of substrate and a portion that is positioned in the second wiring layer from the side of the substrate. According to these embodiments, it is more preferable that the second wiring layer has a resistance lower than a resistance of the first wiring layer. Also, the second wiring layer may have a melting point lower than that of the first wiring layer.

In order to improve the aperture ratio, it is preferable that the display device substrate includes a plurality of pixel switching transistors that are connected in series, and the plurality of pixel switching transistors overlap with the data wiring when the main surface of the substrate is viewed in plane, and it is more preferable that the plurality of pixel switching transistors include gate electrodes, respectively, the gate electrodes being positioned in a first wiring layer from the side of the substrate and arranged separately between the plurality of pixel switching transistors, the gate electrodes are connected to each other through a connection part that is positioned in a second wiring layer from the side of the substrate, and the connection part overlaps with the data wiring when the main surface of the substrate is viewed in plane.

If the plurality of pixel switching transistors overlap with the data wiring when the main surface of the substrate is viewed in plane, the transistors may overlap with the data wiring to such an extent that the above-mentioned advantages are exhibited. More specifically, at least a portion of the plurality of pixel switching transistors overlaps with the data wiring when the main surface of the substrate is viewed in plane. In order to more improve the aperture ratio, it is more preferable that the display device substrate has a plurality of pixel switching transistors that are connected in series, at least a channel region of the plurality of pixel switching transistors is arranged within a region of the data wiring when the main surface of the substrate is viewed in plane.

If the connection part overlaps with the data wiring when the substrate main surface is viewed in plane, the connection part overlaps with the data wiring to such an extent that the above-mentioned advantages are exhibited. More specifically, when the substrate plane is viewed in plane, at least a portion of the connection parts overlaps with the data wiring. In order to more improve the aperture ratio, it is still more preferable that the plurality of pixel switching transistors include gate electrodes, respectively, the gate electrodes being positioned in a first wiring layer from the side of the substrate and arranged separately between the plurality of pixel switching transistors, the gate electrodes are connected to each other through a connection part that is positioned in a second wiring layer from the side of the substrate, and the connection part is positioned in the data wiring when the main surface of the substrate is viewed in plane.

In order to suppress a variation of the width of the wiring in the wiring layer and to suppress a short-circuit generated in the wiring layer, it is preferable that at least one of second or higher interlayer insulating films from the side of the substrate includes a flattening film having a flattening function. It is more preferable that each of second or higher interlayer insulating films from the side of the substrate includes a flattening film having a flattening function. As a result, an inorganic insulating film can be used as the first interlayer insulating film.

In order to suppress a variation of the width of the wiring in the wiring layer and to suppress a short-circuit in the wiring layer, and further to perform hydrogenation of the semiconductor layer easily, in the display device substrate, it is preferable that the first interlayer insulating film from the side of the substrate is an inorganic insulating film, and at least one of the second or higher interlayer insulating films from the side of the substrate includes a flattening film having a flattening function. It is more preferable that the first interlayer insulating film is an inorganic interlayer insulating film, and each of the second or higher interlayer insulating films from the side of the substrate includes a flattening film having a flattening function.

Resin materials and/or spin-on-glass materials are preferable as a material for the flattening film. That is, it is preferable that the flattening film is formed from at least one of a resin material and a spin-on-glass material. Thus, it is preferable that the flattening film is formed from a liquid material. The flattening film may include at least one of a resin material and a spin-on-glass material.

It is preferable that the flattening film has a substantially flat surface. The surface may have an uneven part that gives a difference in level of about 500 nm (preferably 200 nm) or less. If the surface of the flattening film has an uneven part, it is preferable that a radius of curvature of the uneven part is not smaller than the difference in thickness of the film (the difference in level). Even if the flattening film has such an uneven part, the advantage of suppressing a variation in width of the wiring in the wiring layer and the advantage of suppressing generation of a short-circuit in the wiring layer can be exhibited.

The present invention is also a display device including the display device substrate. The display device of the present invention can exhibit the above-mentioned advantages because it includes the display device substrate, as mentioned above. If a data storage memory is formed in a pixel of the display device substrate having the multi-layered wirings of the present invention, for example, if a threshold voltage correcting circuit (circuit for correcting a threshold voltage) is formed, a more sophisticated circuit can be formed in the display device of the present invention.

The above-mentioned display device is not especially limited, examples of the display device include a liquid crystal display device, an organic electroluminescent display device (organic EL display device), and a display device produced using a microcapsule electrophoresis technology. In order to improve the aperture ratio of the pixel, it is preferable that the display device is a liquid crystal display device.

The present invention is further a wiring substrate including, on a main surface of a substrate, a structure of alternating layers of: a plurality of interlayer insulating films each including a connection hole; and a plurality of wiring layers, wherein two of the plurality of wiring layers are connected to each other through the connection hole of an interlayer insulating film that is positioned between the two wiring layers, when the main surface of the substrate is viewed in plane, a connection hole of an n-th (n being any natural number) interlayer insulating film from a side of the substrate is positioned not to overlap with a connection hole of an (n+1)th interlayer insulating film from the side of the substrate but to overlap with a connection hole of an (n+2)th interlayer insulating film from the side of the substrate. Thus, disconnection and patterning defects of the wiring layer caused by the difference in level attributed to the connection hole suppressed and the area of the wiring pattern can be decreased (or minimized more preferably) if the connection holes are arranged not to overlap with each other between interlayer insulating films adjacent in the stacking direction but to overlap with each other in every other film.

The above-mentioned connection hole may be a contact hole or a through-hole. The above-mentioned through-hole may be a so-called via-hole.

If the n-th connection hole and the (n+1)th connection hole are positioned not to overlap with each other when the main surface of the substrate is viewed in plane, the positions of the connection holes are different to such an extend that the advantages of the wiring substrate of the present invention are exhibited, and more specifically, the two connection holes do not overlap with each other when the main surface of the substrate is viewed in plane.

If the n-th connection hole and the (n+2)th connection hole are positioned to overlap with each other when the main surface of the substrate is viewed in plane, the positions of the connection holes overlap with each other to such an extend that the advantages of the wiring substrate of the present invention are exhibited, and more specifically, the two connection holes at least partly overlap with each other when the main surface of the substrate is viewed in plane. Accordingly, when the substrate main surface is viewed in plane, the positions of the n-th connection hole and the (n+2)th connection hole are not necessarily completely the same. That is, when the main surface of the substrate is viewed in plane, the positions of the two connection holes may be different as long as the connection holes at least partly overlap with each other. In order to more exhibit the advantages of the wiring substrate of the present invention, an embodiment in which the n-th connection hole and the (n+2)th connection hole are arranged in substantially the same region when the main surface of the substrate is viewed in plane or an embodiment in which one of the n-th connection hole and the (n+2)th connection hole is positioned within a range of the other hole when the main surface of the substrate is viewed in plane is preferable.

The above-mentioned wiring substrate may be a circuit substrate, or a display device substrate.

The configuration of the wiring substrate of the present invention is not especially limited. The wiring substrate may or may not include other components as long as such components are essentially included.

In order to suppress a variation of the width of the wiring in the wiring layer and to suppress generation of a short-circuit in the wiring layer, it is preferable that at least one of the interlayer insulating films includes a flattening film having a flattening function, and it is more preferable that the interlayer insulating films except for the first interlayer insulating film from the side of the substrate include a flattening film having a flattening function.

Resin materials and/or spin-on-glass materials are preferable as a material for the flattening film. That is, it is preferable that the flattening film is formed from at least one of a resin material and a spin-on-glass material. Thus, it is preferable that the flattening film is formed from a liquid material. The flattening film may include at least one of a resin material and a spin-on-glass material.

It is preferable that the flattening film has a substantially flat surface. The surface may have an uneven part that gives a difference in level of about 500 nm (preferably 200 nm) or less. If the surface of the flattening film has an uneven part, it is preferable that a radius of curvature of the uneven part is not smaller than the difference in thickness of the film (the difference in level). Even if the flattening film has such an uneven part, the advantage of suppressing a variation in width of the wiring in the wiring layer and the advantage of suppressing generation of a short-circuit in the wiring layer can be exhibited.

The above-mentioned preferable embodiments of the wiring substrate of the present invention may be appropriately combined.

Effect of the Invention

According to the display device substrate, the display device, and the wiring substrate of the present invention, the wirings can be more flexibly designed and/or an area of the wiring layers can be decreased while defects of the wiring layer can be suppressed.

BEST MODES FOR CARRYING OUT THE INVENTION

The present invention is mentioned below in more detail below with reference to drawings, but not limited thereto.

Embodiment 1

FIG. 1 is a schematic view showing a display device substrate in accordance with Embodiment 1. FIG. 1(a) is a plan view thereof. FIG. 1(b) is a cross-sectional view of the substrate taken along line X1-Y1 in FIG. 1(a). In FIGS. 1(a), 2(a), 3(a), 4(a), 5(a), 6(a), and 8(a), the shaded region shows a first wiring layer; the region indicated by the thick line shows a second wiring layer; the region indicated by the dotted line shows a third wiring layer; and the region indicated by the thick broken line shows a fourth wiring layer.

The display device substrate 1 in accordance with Embodiment 1 is a liquid crystal display device substrate and includes pixels arrayed in a matrix pattern. More specifically, as shown in FIG. 1, the display device substrate 1 includes, on a main surface of a substrate 110, a base layer 111, pixel switching transistors 113a and 113b, a plurality of gate wirings 118, a plurality of storage capacitor wirings 121, a pixel data storage capacitor element 120, a plurality of data wirings 115, connection parts 117a, 117b, and 117c, a first interlayer insulating film 151 having contact holes 154a, 154b, and 154c, a second interlayer insulating film 152 having through-holes 155a and 155b, and a third interlayer insulating film 153 having a through-hole 155c, and a pixel electrode 116. Thus, the display device substrate 1 is an active matrix substrate.

The display device substrate 1 has, on the main surface of the substrate 110, a structure in which the base layer 111, a semiconductor layer 130, a gate insulating film 112 having contact holes 154a and 154b, a first wiring layer 141, the first interlayer insulating film 151, a second wiring layer 142, the second interlayer insulating film 152, a third wiring layer 143, the third interlayer insulating film 153, and the pixel electrode 116 are stacked in this order from the substrate 110 side. Thus, the contact holes 154a and 154b are connection holes that penetrate the first interlayer insulating film 151 and the gate insulating film 112. The semiconductor layer 130 has channel regions 131a and 131b, low concentration impurity regions 132a, 132b, 132c, 132d, and 132e, and high concentration impurity regions 133a, 133b, and 133c.

In the present description, the semiconductor layer is a layer formed from at least a semiconductor material. The contact hole is a hole for connecting the semiconductor layer or the first wiring layer to any one of the second wiring layer and wiring layers that are positioned on the upper layer side of the second wiring layer. The through-hole (via-hole) is a hole for connecting any two of the second wiring layer and the wiring layers that are positioned on the upper layer side of the second wiring layer. The upper layer side is a side further from the substrate. The lower layer side is a side closer to the substrate. The size of the contact hole and the through-hole can be appropriately determined. If the contact hole and the through-hole have a substantially square shape when the substrate main surface for display devices is viewed in plane, the holes are a generally 2 to 4 µm square, and preferably 3 µm square.

The plurality of gate wirings 118 and the plurality of storage capacitor wirings 121 that are arranged parallel to each other are arranged to be perpendicular to the plurality of data wirings 115. That is, the plurality of gate wirings 118, the plurality of storage capacitor wirings 121, and the plurality of data wirings 115 are arranged to form a lattice pattern. A region partitioned by adjacent two storage capacitor wirings 121 and adjacent two data wirings 115 is one pixel region.

The transistor 113a is composed of the channel region 131a, the low concentration impurity regions 132a and 132b, the high concentration impurity regions 133a and 133b, the gate insulating film 112, and the gate electrode 119a. Thus, the transistor 113a has an LDD (lightly doped drain) structure. The low concentration impurity regions 132a and 132b function as an LDD region. The high concentration impurity regions 133a and 133b function as a source-drain region. The transistor 113b also has an LDD structure, and it is composed of the channel region 131b, the low concentration impurity regions 132c and 132d, the high concentration impurity regions 133b and 133c, the gate insulating film 112, and the gate electrode 119b. Thus, the transistors 113a and 113b are top-gate (planar) thin film transistors (TFTs). The transistors 113a and 113b are connected to each other in series through the high concentration impurity region 133b (the source-drain region of the transistors 113a and 113b). This configuration allows generation of leakage current from the pixel electrode 116 to be suppressed.

The gate electrodes 119a and 119b are constituted by the first wiring layer 141. The gate electrode 119b is connected to the gate wiring 118 constituted by the first wiring layer 141, and a part of the gate wiring 118 functions as the gate electrode 119a. Thus, the gate electrodes 119a and 119b and the gate wiring 118 are integrally constituted by the first wiring layer 141. The width of the gate electrodes 119a and 119b in the channel length direction is about 2 to 5 μm (preferably 3 to 4 μm). The gate wiring 118 has a width of about 5 to 15 μm (preferably 6 to 10 μm).

In the present description, the gate electrode is a region of the wiring layer, facing the channel constituting the pixel switching transistor. The gate wiring is a wiring for transmitting a scanning signal and it may be a gate line, a scanning line, a scanning signal line, and the like. The data wiring is a wiring for transmitting a pixel signal (image data) and it may be a data line, a data signal line, an image signal line, and the like.

The connection part 117a is constituted by the second wiring layer 142 into an island shape to overlap with the high concentration impurity region 133a. The connection part 117b is constituted by the second wiring layer 142 into an island shape to overlap with the high concentration impurity region 133c. The connection part 117c is also constituted by the third wiring layer 143 into an island shape to overlap with the high concentration impurity region 133c.

The data wiring 115 is constituted by the third wiring layer 143. The data wiring 115 is connected to the transistor 113a through the connection part 117a. The data wiring 115 is connected to the connection part 117a through the through-hole 155a. The connection part 117a is connected to the high concentration impurity region 133a that functions as a source-drain region of the transistor 113a through the contact hole 154a. The contact hole 154a and the through-hole 155a are arranged not to overlap with each other. The data wiring 115 has a width of about 5 to 15 μm (preferably 6 to 10 μm).

The pixel electrode 116 is connected to the transistor 113b through the connection parts 117b and 117c. The pixel electrode 116 is connected to the connection part 117c through the through-hole 155c. The connection parts 117b and 117c are connected to each other through the through-hole 155b. The connection part 117b is connected to the high concentration impurity region 133c that functions as the source-drain region of the transistor 113b through the contact hole 154b. The contact hole 154b and the through-hole 155c are arranged to overlap with each other. The contact hole 154b and the through-hole 155c are arranged not to overlap with the through-hole 155b. The pixel electrode 116 is arranged in a pixel region partitioned by adjacent two storage capacitor wirings 121 and adjacent two data wirings 115.

The pixel data storage capacitor element 120 is composed of a storage capacitor lower electrode (lower electrode constituting the pixel data storage capacitor element) 122, the gate insulating film 112, and a storage capacitor upper electrode (upper electrode constituting the pixel data storage capacitor element) 123. The storage capacitor lower electrode 122 is constituted by the semiconductor layer 130 and connected to the high concentration impurity region 133c that functions as the source-drain region of the transistor 113b. That is, the storage capacitor lower electrode 122 is formed in the semiconductor layer 130, which forms the channel regions 131a and 131b, the low concentration impurity regions 132a, 132b, 132c, and 132d, and the high concentration impurity regions 133a, 133b, 133c, and the like, of the transistors 113a and 113b. More specifically, the storage capacitor lower electrode 122 includes the low concentration impurity region 132e facing the storage capacitor upper electrode 123, and the high concentration impurity region 133c surrounding the region 132e. The electrode 123 is constituted by the first wiring layer 141. The storage capacitor wiring 121 is constituted by the second wiring layer 142 and it is connected to the electrode 123 through the contact hole 154c. The elements 120 in respective pixels adjacent in the lateral direction in FIG. 1(a) are connected to each other through the storage capacitor wiring 121. The electrode 123 is arranged within a region where the electrode 122 is arranged when the main surface of the substrate 110 is viewed in plane.

A production method of the display device substrate 1 is mentioned below.

The substrate 110 is prepared first. The substrate 110 is preferably a transparent and/or insulating substrate. It is preferable that the substrate 110 is a transparent and insulating substrate if the display device substrate is used in a transmissive liquid crystal display device. The material for the substrate 110 is not especially limited. A glass, quartz, or silicon substrate, or a substrate having a metal or stainless surface on which an insulating film is formed, is mentioned. A heat-resistant plastic substrate that can withstand treatment temperatures may be used as the substrate 110.

Then, the base layer 111 is formed to have a thickness of 100 to 400 nm (preferably 200 to 300 nm). A silicon-containing insulating film (for example, a $SiO_2$ film, a SiN film, a SiNO film) that is formed by plasma CVD or sputtering can be used as the base layer 111. The base layer 111 makes it possible to suppress impurities such as an alkali metal element from diffusing from the substrate 110 and to reduce a variation in electrical characteristics among the TFTs. The base layer 111 may have a structure composed of a single insulating film, or two or more stacked insulating films.

Then, the semiconductor layer 130 is formed into an island shape to have a thickness of 30 to 100 nm (preferably 40 to 50 nm). More specifically, the semiconductor layer 130 is formed as follows: an amorphous semiconductor film having an amorphous structure is formed by publicly known means (sputtering, LPCVD, plasma CVD, and the like); this amorphous semiconductor film is crystallized by a publicly known crystallization treatment (e.g., laser crystallization, thermal crystallization, for example, using a catalyst such as nickel); and the obtained crystal semiconductor film is patterned into a desired shape by photolithography. The material for the semiconductor layer 130 is not especially limited. Silicon, an alloy of silicon and germanium (SiGe), and the like, are preferably mentioned.

The gate insulating film 112 is formed to have a thickness of 30 to 100 nm (preferably 50 to 70 nm). A silicon-containing insulating film (e.g., a $SiO_2$ film, a SiN film, a SiNO film) formed by plasma CVD or sputtering can be used as the gate insulating film 112. The gate insulating film 112 may have a structure composed of a single insulating film, or two or more stacked insulating films. A $SiO_2$ film is particularly preferable as the gate insulating film 112. It is preferable that a layer that is contact with the semiconductor layer 130 is a $SiO_2$ film if the gate insulating film 112 has a multi-layer structure. As a result, the interface state between the gate insulating film 113 and the semiconductor layer 130 (preferably silicon layer) can be reduced, and so electrical characteristics of the transistors 113a and 113b can be improved.

For the purpose of controlling threshold voltages of the transistors 113a and 113b, ions of an impurity element such as boron (B) ions are implanted into the entire semiconductor layer 130 at 50 kV and a dose of $5\times10^{12}$ to $3\times10^{13}$ cm$^{-2}$. The concentration of the impurity element in the semiconductor layer 130 is about $5\times10^{16}$ to $5\times10^{17}$ cm$^{-3}$.

While the semiconductor layer 130 except for a region that is to constitute the storage capacitor lower electrode 122 is covered with a resist, ions of an impurity element such as phosphorus (P) ions are implanted into the semiconductor layer 130 in the region that is to constitute the electrode 122 at 70 kV and a dose of $1\times10^{13}$ to $1\times10^{14}$ cm$^{-2}$ (low concentration doping). The concentration of the impurity element in the region that is to constitute the electrode 122 is about $1\times10^{17}$ to $1\times10^{18}$ cm$^{-3}$. As a result, the low concentration impurity region 132e constituting the electrode 122 is formed. Then the resist is removed.

Successively, a conductive film is formed by sputtering to have a thickness of 200 to 600 nm (preferably 300 to 400 nm), and then this film is patterned into a desired shape by photolithography to form the first wiring layer 141. As a result, the gate electrodes 119a and 119b, the gate wiring 118 and the storage capacitor upper electrode 123 are formed. Preferable examples of the material for the first wiring layer 141 include high melting point metals such as tantalnum (Ta), tungsten (W), titanium (Ti), and molybdenum (Mo), and alloys or compounds, containing these high melting point metals as a main component. Nitrides are preferable as the compound containing a high melting point metal as a main component. The first wiring layer 141 may have a structure in which conductive films formed from these materials are stacked.

Then using the first wiring layer 141 as a mask, ions of an impurity element such as phosphorus (P) ions are implanted into the semiconductor layer 130 in a self-alignment manner at 70 kV and a dose of $1\times10^{13}$ to $3\times10^{13}$ cm$^{-2}$ (low concentration doping). The concentration of the impurity element in the semiconductor layer 130 is about $1\times10^{13}$ to $3\times10^{13}$ cm$^{-3}$. While regions of the semiconductor layer 130 that are to constitute LDD regions of the transistors 113a and 113b are covered with a resist, ions of an impurity element such as phosphorus (P) ions are implanted into the semiconductor layer 130 at 50 kV and a dose of $5\times10^{15}$ to $1\times10^{16}$ cm$^{-2}$ (high concentration doping). The concentration of the impurity element in the semiconductor layer 130 is about $1\times10^{19}$ to $1\times10^{20}$ cm$^{-3}$. As a result, the low concentration impurity regions 132a, 132b, 132c, and 132d that function as an LDD region are formed. The high concentration impurity regions 133a and 133b that function as a source-drain region are formed and the high concentration impurity region 133c that function as a source-drain region or a storage capacitor lower electrode 122 is formed. Then the resist is removed.

Then the first interlayer insulating film 151 is formed to have a thickness of 0.5 to 1.5 μm (preferably 0.7 to 1.0 μm). A silicon-containing insulating film (e.g., a SiO$_2$ film, a SiN film, a SiNO film) formed by plasma CVD or sputtering can be used as the first interlayer insulating film 151. The film 151 may have a structure composed of a single insulating film, or two or more stacked insulating films. The film 151 is particularly preferably a multi-layer film composed of a hydrogen-containing silicon nitride (SiN:H) film with a thickness of 0.2 to 0.4 μm and a SiO$_2$ film with a thickness of 0.4 to 0.6 μm, stacked from the first wiring layer 141 side. Then the entire substrate 110 is heated at 400 to 450° C. for about 0.5 to 1.0 hour, thereby hydrogenating and activating the semiconductor layer 130. The hydrogen contained in the silicon nitride film can be effectively used for the hydrogenation of the semiconductor layer 130. Then, the first interlayer insulating film 151 and the gate insulating film 112 are provided with the contact holes 154a and 154b, and further the first interlayer insulating film 151 is provided with the contact hole 154c by photolithography. As a result, apart of the source-drain region of the transistors 113a and 113b and a part of the electrode 123 are exposed.

Then the second wiring layer 142 is formed in the following manners: a conductive film is formed by sputtering to have a thickness of 400 to 1000 nm (preferably 600 to 800 nm); this conductive film is patterned into a desired shape by photolithography. As a result, the storage capacitor wiring 121 and the connection parts 117a and 117b are formed. The connection part 117a and the source-drain region of the transistor 113a are connected to each other through the contact hole 154a. The connection part 117b and the source-drain region of the transistor 113b are connected to each other through the contact hole 154b. The storage capacitor wiring 121 and the storage capacitor upper electrode 123 are connected to each other through the contact hole 154c. After this, a heating treatment does not need to be performed, and so the second wiring layer 142 can be formed from a material with a low melting point. Accordingly, preferable examples of the material for the second wiring layer 142 include low resistance metals such as aluminum (Al), copper (Cu), and silver (Ag), and alloys or compounds, containing these low resistance metals as a main component. The second wiring layer 142 may have a structure in which conductive films formed from these materials are stacked.

The second interlayer insulating film 152 is formed to have a thickness of 1.0 to 3.0 μm (preferably 1.5 to 2.0 μm). The second interlayer insulating film 152 is formed by applying an insulating film material by spin coating, and the like, and appropriately baking the material. Resin materials, spin-on glass materials (SOG materials), and the like, are preferable as a material for the second insulating film 152. The use of such a material makes it possible to flatten the second interlayer insulating film 152 surface. Thus, the second interlayer insulating film 152 is a flattening film having a flattening function. Polyimides, acryls, polyamides, polyimide-amides, BCB (benzocyclobutene), and the like, may be mentioned as the resin material. Particularly, acrylic resins and photosensitive acrylic resins are preferable. The SOG materials are materials capable of forming a glass film (silica coating film) by coating method such as spin coating. More specifically, a SOG material having a Si—O—C bond as a skeleton, a SOG material having a Si—C bond as a skeleton, are preferable as the SOG materials. It is preferable that the resin material and the SOG material have photosensitivity. As a result, the second interlayer insulating film 152 is formed, and then exposed and developed to be provided with connection holes (specifically, through-holes 155a and 155b). The second interlayer insulating film 152 may have a structure in which a plurality of insulating films formed from a resin material and/or a SOG material are stacked. The second interlayer insulating film 152 may have a structure in which an insulating film (flattening film) formed from at least one of a resin material and a SOG material and an insulating film formed by CVD, sputtering and the like (for example, an inorganic insulating film) are stacked. More specifically, for example, in order to improve adhesion of a wiring layer that is formed on the flattening film and to protect the flattening film when the wiring layer is etched, an insulating film (for example, an inorganic insulating film such as a SiO$_2$ film, a SiN film, and a SiNO film) may be formed on the flattening film by CVD or sputtering. The thickness of the second interlayer insulating film 152 is set to be larger than the thickness of the first interlayer insulating film 151. It is preferable that the second interlayer insulating film 152 has a substantially flat surface. However, the surface may have an uneven part that gives a difference in level of about 500 nm (preferably 200 nm) or less. If the surface of the second interlayer insulating film 152 has an uneven part, it is preferable that a radius of curvature of the uneven part is not smaller than the difference in thickness of the film (the difference in level). As a result, a wiring layer that is positioned on the upper layer side of the second interlayer insulating film 152 (specifically, the third wiring layer 143) can be effectively suppressed from remaining after being etched. Then, the second interlayer insulating film 152 is provided with the through-holes 155a and 155b by photolithography. As a result, a part of the connection part 117a and a part of the connection part 117b are exposed. The through-hole 155a is formed so as not to overlap with the contact hole 154a, and the through-hole 155b is formed so as not to overlap with the contact hole 154b.

Then the third wiring layer 143 is formed in the following manners: a conductive film is formed by sputtering to have a thickness of 400 to 1000 nm (preferably 600 to 800 nm); this conductive film is patterned into a desired shape by photolithography. As a result, the data wiring 115 and the connection part 117c are formed. The data wiring 115 and the connection part 117a are connected to each other through the through-hole 155a. The connection parts 117c and 117b are connected to each other through the through-hole 155b. The third wiring layer 143 can be formed from a material with a low melting point, similarly to the second wiring layer 142. Accordingly, preferable examples of the material for the third wiring layer 143 include low resistance metals such as aluminum (Al), copper (Cu), and silver (Ag), and alloys or compounds, containing these low resistance metals as a main component. The third wiring layer 143 may have a structure in which conductive films formed from these materials are stacked.

Then the third interlayer insulating film 153 is formed to have a thickness of 1.0 to 3.0 μm (preferably 1.5 to 2.0 μm). The third interlayer insulating film 153 is formed by coating an insulating layer material by spin coating and the like, and appropriately baking the material. Resin materials, spin-on glass materials (SOG materials), and the like are preferable as a material for the third insulating film 153 similarly to the second wiring layer 142. The use of such a material makes it possible to flatten the third interlayer insulating film 153 surface. Thus, the third interlayer insulating film 153 is a flattening film having a flattening function. Similarly to the second interlayer insulating film 152, from viewpoint of easily forming a connection hole (specifically, the through-hole 155c), it is preferable that the resin material and the SOG material has photosensitivity. The third interlayer insulating film 153 may have a structure in which a plurality of insulating films formed from a resin material and/or a SOG material are stacked. Similarly to the second interlayer insulating film 152, the third interlayer insulating film 153 may have a structure in which an insulating film (flattening film) formed from at least one of a resin material and a SOG material, and an insulating film (for example, an inorganic insulating film) formed by CVD, sputtering and the like, are stacked. It is preferable that the third interlayer insulating film 153 has a substantially flat surface. However, the surface may have an uneven part that gives a difference in level of about 500 nm (preferably 200 nm) or less, similarly to the second interlayer insulating film 152. If the surface of the third interlayer insulating film 153 has an uneven part, it is preferable that a radius of curvature of the uneven part is not smaller than the difference in thickness of the film (the difference in level). Then, the third interlayer insulating film 153 is provided with the through-hole 155c by photolithography. As a result, a part of the connection part 117c is exposed. The through-hole 155c is formed so as not to overlap with the through-hole 155b but to overlap with the contact hole 154b.

Finally, a transparent conductive film is formed by sputtering to have a thickness of 80 to 120 nm (preferably 100 to 110 nm), and then, the pixel electrode 116 is formed by patterning the transparent conductive film into a desirable shape by photolithography. As a result, the pixel electrode 116 is connected to the connection part 117c through the through-hole 155c. Materials for transparent conductive films, particularly indium tin oxide (ITO) are preferable as a material for the pixel electrode 116. If the display device substrate of the present Embodiment is used in a reflective liquid crystal display device, preferable examples of the material for the pixel electrode 116 include metals with high reflectivity such as Al and Ag, and alloys or compounds containing these metals with high reflectivity as a main component.

According to the display device substrate 1 of the present Embodiment, the data wiring 115 is positioned in the third wiring layer 143, and so the first wiring layer 141 and the second wiring layer 142 can be used as the gate wiring 118, the storage capacitor wiring 121, the electrodes constituting the pixel data storage capacitor element 120, and the like. As a result, the wirings can be more flexibly designed.

The data wiring 115 is positioned in the third wiring layer 143, the gate wiring 118 is positioned in the first wiring layer 141, and the storage capacitor wiring 121 is positioned in the second wiring layer 142. So the data wiring 115 can be easily arranged with a distance from the gate wiring 118 and the storage capacitor wiring 121. The parasitic capacitance in the data wiring 115 is reduced, and a time for writing data into a pixel can be shortened. As a result, generation of display defects due to writing deficiency of signal voltage can be suppressed, and electrical power consumption during display panel driving can be reduced.

The second interlayer insulating film 152 has a thickness larger than that of the first interlayer insulating film 151. The parasitic capacitance in the data wiring 115 can be more effectively reduced. So a further reduction in electrical power consumption and higher-speed driving of the display device are permitted.

The storage capacitor upper electrode 123 is arranged within a region overlapping with the storage capacitor lower electrode 122 when the main surface of the substrate 110 is viewed in plane. The storage capacitor upper electrode 123 does not overlap with the edge of the storage capacitor lower electrode 122 with a low withstand voltage (a region where the gate insulating film 112 covers an edge of the storage capacitor lower electrode 122 and has a particularly small thickness). Accordingly, generation of the withstand voltage defects can be suppressed.

The second interlayer insulating film 152 includes a flattening film, and so the conductive film for forming the third wiring layer 143 can be effectively suppressed from having an uneven surface. Accordingly, a variation in width and size of the data wiring 115 and/or the connection part 117c positioned in the third wiring layer 143, which is caused by a difference in focal depth generated when the conductive film is patterned by photolithography, can be suppressed. Further, a short-circuit between the data wiring 115 and/or the connection part 117c, which is caused when the conductive film remains even after being etched due to the uneven part, can be suppressed.

The third interlayer insulating film 153 includes a flattening film, and so generation of the uneven part of the pixel electrode 116 can be effectively suppressed. Accordingly, defects such as disconnection, patterning defects, and a short-circuit of the pixel electrode 116 can be suppressed. If the display device substrate 1 of the present Embodiment is applied to a liquid crystal display device, a reduction in display qualities, due to a variation in alignment of liquid crystal molecules in the uneven part which the pixel electrode 116 has, can be suppressed.

The first interlayer insulating film 151 is not a flattening film, and so an inorganic insulating film which is preferably used for hydrogenating the semiconductor layer 130 and excellent in heat resistance can be used as a material for the first interlayer insulating film 151.

When the main surface of the substrate 110 is viewed in plane, the first contact hole 154a and the through-hole 155a that are connection holes of the first interlayer insulating film 151 and the second interlayer insulating film 152 that are adjacent to each other are arranged at different positions. Accordingly, compared with a conventional case that connection holes of adjacent interlayer insulating films overlap with each other in a stacking direction, the difference in level, generated due to the contact hole 154a and/or the through-hole 155a, can be reduced. As a result, disconnection and patterning defects of the data wiring 115 can be suppressed.

When the main surface of the substrate 110 is viewed in plane, the contact hole 154b and the through-hole 155b that are connection holes of the first interlayer insulating film 151 and the second interlayer insulating film 152 that are adjacent to each other are arranged at different positions. Accordingly, compared with a conventional case that connection holes of adjacent interlayer insulating films overlap with each other in a stacking direction, the difference in level, generated due to the contact hole 154b and/or the through-hole 155b, can be reduced. As a result, disconnection and patterning defects of the connection part 117c can be suppressed.

When the main surface of the substrate 110 is viewed in plane, the through-holes 155b and 155c that are connection holes of the second interlayer insulating film 152 and the third interlayer insulating film 153 that are adjacent to each other are arranged at different positions. Accordingly, compared with a conventional case that connection holes of adjacent interlayer insulating films overlap with each other in a stacking direction, the difference in level, generated due to the through-holes 155b and/or 155c, can be reduced. As a result, disconnection and patterning defects of the pixel electrode 116 can be suppressed.

When the main surface of the substrate 110 is viewed in plane, the contact hole 154b and the through-hole 155c that are connection holes of the first interlayer insulating film 151 and the third insulating film 153, which are stacked with the second interlayer insulating film 152 therebetween, are arranged to overlap with each other. Accordingly, as mentioned above, disconnection and patterning defects can be suppressed, and simultaneously, an area of the connection hole and the wiring pattern can be decreased as much as possible.

Embodiment 2

FIG. 2 is a schematic view showing a display device substrate in accordance with Embodiment 2. FIG. 2(a) is a plan view thereof. FIG. 2(b) is a cross-sectional view of the substrate taken along line X2-Y2 in FIG. 2(a). FIG. 3 is a plan view schematically showing a gate wiring in accordance with a modified example of Embodiment 2.

A display device substrate 2 in Embodiment 2 is a substrate for a liquid crystal display device and includes pixels arrayed in a matrix pattern. More specifically, the display device substrate 2 includes, as shown in FIG. 2, on a main surface of the substrate 210, a base layer 211, pixel switching transistors 213a and 213b, a plurality of gate wirings 218a and 218b, a plurality of storage capacitor wirings 221, a pixel data storage capacitor element 220, a plurality of data wirings 215, connection parts 217a, 217b, and 217c, a first interlayer insulating film 251 having contact holes 254a, 254b, and 254c, a second interlayer insulating film 252 having through-holes 255a and 255b, a third interlayer insulating film 253 having a through-hole 255c, and a pixel electrode 216. Thus, the display device substrate 2 is an active matrix substrate.

The display device substrate 2 has, on the main surface of the substrate 210, a structure in which the base layer 211, a semiconductor layer 230, a gate insulating film 212 having contact holes 254a and 254b, a first wiring layer 241, and the first interlayer insulating film 251, a second wiring layer 242, the second interlayer insulating film 252, a third wiring layer 243, the third interlayer insulating film 253, and the pixel electrode 216 are stacked in this order from the substrate 210 side. Thus, the contact holes 254a and 254b are connection holes that penetrate the first interlayer insulating film 251 and the gate insulating film 212. The semiconductor layer 230 has channel regions 231a and 231b, low concentration impurity regions 232a, 232b, 232c, and 232d, and high concentration impurity regions 233a, 233b, and 233c.

A plurality of gate wirings 218b and a plurality of storage capacitor wirings 221 that are arranged parallel to each other are arranged to be perpendicular to a plurality of data wirings 215. That is, the plurality of gate wirings 218, the plurality of storage capacitor wirings 221, and the plurality of data wirings 215 are arranged to form a lattice pattern. A region partitioned by adjacent two storage capacitor wirings 221 and adjacent two data wirings 215 is one pixel region.

Similarly to the transistor 113a in Embodiment 1, the transistor 213a has an LDD (lightly doped drain) structure. The transistor 213a is a top gate TFT that is composed of: the channel region 231a; the low concentration impurity regions 232a and 232b that function as an LDD region, the high concentration impurity regions 233a and 233b that function as a source-drain region; the gate insulating film 212; and the gate electrode 219a. Similarly to the transistor 113b in accordance with Embodiment 1, the transistor 213b also has an LDD structure. The transistor 213b is a top gate TFT composed of the channel region 231b; the low concentration impurity regions 232c and 232d that function as an LDD region, the high concentration impurity regions 233b and 233c that function as a source-drain region; the gate insulating film 212; and the gate electrode 219b. The transistors 213a and 213b are connected to each other in series through the high concentration impurity region 233b (the source-drain region of the transistors 213a and 213b). This configuration allows generation of leakage current from the pixel electrode 216 to be suppressed.

The gate electrodes 219a and 219b are constituted by the first wiring layer 241. The gate electrodes 219a and 219b are connected to the gate wiring 218a that is formed into an island shape and constituted by the first wiring layer 241. Thus, the gate electrodes 219a and 219b, and the gate wiring 218a are integrally constituted by the first wiring layer 241. The gate wiring 218b is constituted by the second wiring layer 242. The gate wiring 218a and the data wiring 218b are connected to each other trough the contact hole 254c. The width of the gate electrodes 219a and 219b in the channel length direction is about 2 to 5 µm (preferably 3 to 4 µm). A region of the gate wiring 218a where the contact hole 254a is not arranged has a width of about 2 to 5 µm (preferably 3 to 4 µm). A region of the gate wiring 218b where the contact hole 254a is not arranged has a width of about 2 to 5 µm (preferably 3 to 4 µm). Thus, the gate wiring 218b of the present Embodiment can be formed to have a width smaller than that of the gate wiring 118 in Embodiment 1.

The connection part 217a is constituted by the second wiring layer 242 into an island shape to overlap with the high concentration impurity region 233a. The connection part 217b is constituted by the second wiring layer 242 into an island shape to overlap with the high concentration impurity region 233c. The connection part 217c is also constituted by the third wiring layer 243 into an island shape to overlap with the high concentration impurity region 233c.

The data wiring 215 is constituted by the third wiring layer 243. The data wiring 215 is connected to the transistor 213a through the connection part 217a, similarly to Embodiment 1.

The contact hole 254a and the through-hole 255a are arranged not to overlap with each other. The data wiring 215 has a width of about 5 to 15 μm (preferably 6 to 10 μm).

The pixel electrode 216 is connected to the transistor 213b through the connection parts 217b and 217c similarly to Embodiment 1. The contact hole 254b and the through-hole 255c are arranged to overlap with each other. The contact hole 254b and the through-hole 255c are arranged not to overlap with the through-hole 255b. The pixel electrode 216 is arranged in a pixel region partitioned by adjacent two storage capacitor wirings 221 and adjacent two data wirings 215.

The pixel data storage capacitor element 220 is composed of a storage capacitor lower electrode 222, a gate insulating film 212, and a storage capacitor wiring 221. Thus, the wiring 221 functions also as a storage capacitor upper electrode 223. The electrode 222 is formed in the semiconductor layer 230 and connected to the high concentration impurity region 233c that functions as the source-drain region of the transistor 213b. That is, the electrode 222 is formed in the semiconductor layer 230, which forms the channel regions 231a and 231b, the low concentration impurity regions 232a, 232b, 232c, and 232d, and the high concentration impurity regions 233a, 233b, and 233c, and the like, of the transistors 213a and 213b. More specifically, the electrode 222 includes the low concentration impurity region facing the wiring 221 and the high concentration impurity region not facing the wiring 221. Thus, the pixel data storage capacitor elements 220 in pixels adjacent in the lateral direction in FIG. 2(a) are connected to each other through the wiring 221.

A production method of the display device substrate 2 is mentioned below.

The substrate 210 like the substrate 110 in Embodiment 1 is prepared. Then, similarly to Embodiment 1, the base layer 211, the semiconductor layer 230 having an island shape, and the gate insulating film 212, are formed.

In order to control threshold voltages of the transistors 213a and 213b, the entire semiconductor layer 230 is doped with impurity elements such as boron (B), similarly to Embodiment 1.

While the semiconductor layer 230 except for a region that is to constitute the storage capacitor lower electrode 222 is covered with a resist, impurity elements of phosphorus (P) are implanted into the semiconductor layer 230 in the region that is to constitute the electrode 222 similarly to Embodiment 1. As a result, the low concentration impurity region constituting the electrode 222 is formed. Then the resist is removed.

Similarly to Embodiment 1, the first wiring layer 241 is formed. As a result, the gate electrodes 219a and 219b, the gate wiring 218a, and the storage capacitor wiring 221 (storage capacitor upper electrode 223) are formed.

Similarly to Embodiment 1, the semiconductor layer 230 is doped with impurities such as phosphorus (P) in a self-alignment manner using the first wiring layer 241 as a mask (low concentration doping). While regions of the semiconductor layer 230 that are to constitute LDD regions of the transistors 213a and 213b are covered with a resist, the semiconductor layer 230 is doped with impurities such as phosphorus (P) similarly to Embodiment 1 (high concentration doping). As a result, the low concentration impurity regions 232a, 232b, 232c, and 232d that function as an LDD region are formed. The high concentration impurity regions 233a and 233b that function as a source-drain region are formed and the high concentration impurity region 233c that function as a source-drain region or the storage capacitor lower electrode 222 is formed. Then the resist is removed.

Similarly to Embodiment 1, the first interlayer insulating film 251 is formed and the semiconductor layer 230 is hydrogenated and activated. Similarly to the first interlayer insulating film 151 of Embodiment 1, the film 215 is preferably a multi-layer film including a hydrogen-containing silicon nitride (SiN:H) film and a $SiO_2$ film stacked in this order from the first wiring layer 241 side. Then, the first interlayer insulating film 251 and the gate insulating film 212 are provided with the contact holes 254a and 254b, and the first interlayer insulating film 251 is provided with a contact hole 254c by photolithography. As a result, apart of the source-drain region of the transistors 213a and 213b is exposed and a part of the gate wiring 218a is exposed.

Similarly to Embodiment 1, the second wiring layer 242 is formed. As a result, the gate wiring 218b and the connection parts 217a and 217b are formed. The connection part 217a and the source-drain region of the transistor 213a are connected to each other through the contact hole 254a. The connection part 217b is connected to the source-drain region of the transistor 213b through the contact hole 254b. The gate wiring 218b is connected to the gate wiring 218a through the contact hole 254c. After this, a heating treatment does not need to be performed, and so the second wiring layer 242 can be formed from a material with a low melting point. Accordingly, preferable examples of the material for the second wiring layer 242 include low resistance metals such as Al, Cu, and Ag, and alloys or compounds, containing these low resistance metals as a main component, similarly to Embodiment 1.

Similarly to Embodiment 1, the second interlayer insulating film 252 is formed. The second interlayer insulating film 252 is a flattening film having a flattening function, similarly to the second interlayer insulating film 152 in Embodiment 1. The thickness of the second interlayer insulating film 252 is set to be larger than the thickness of the first interlayer insulating film 251. Then, the second interlayer insulating film 252 is provided with the through-holes 255a and 255b by photolithography. As a result, a part of the connection part 217a and a part of the connection part 217b are exposed. The through-hole 255a is formed so as not to overlap with the contact hole 254a, and the through-hole 255b is formed so as not to overlap with the contact hole 254b.

Similarly to Embodiment 1, the third wiring layer 243 is formed. As a result, the data wiring 215 and the connection part 217c are formed. The data wiring 215 and the connection part 217a are connected to each other through a through-hole 255a, and the connection part 217c is connected to the connection part 217b through the through-hole 255b. The third wiring layer 243 can be formed from a low melting point material, similarly to the second wiring layer 242. Accordingly, preferable examples of the material for the third wiring layer 243 include low resistance metals such as Al, Cu, and Ag, and alloys or compounds, containing these low resistance metals as a main component, similarly to Embodiment 1.

Similarly to Embodiment 1, the third interlayer insulating film 253 is formed. The third interlayer insulating film 253 is a flattening film that has a flattening function as those of the third interlayer insulating film 153 in Embodiment 1. Then, by photolithography, the third interlayer insulating film 253 is provided with a through-hole 255c. As a result, a part of the connection part 217c is exposed. The through-hole 255c is formed so as not to overlap with the through-hole 255b but to overlap with the contact hole 254b.

Finally, similarly to Embodiment 1, the pixel electrode 216 is formed. As a result, the pixel electrode 216 and the connection part 217c are connected to each other through the through-hole 255c.

According to the display device substrate 2 of the present Embodiment, the data wiring 215 is positioned in the third wiring layer 243, and so similarly to Embodiment 1, the wirings can be more flexibly designed.

The data wiring 215 is positioned in the third wiring layer 243; the gate wiring 218a and the storage capacitor wiring 221 are positioned in the first wiring layer 241, and the gate wiring 218b is positioned in the second wiring layer 242. As a result, similarly to Embodiment 1, generation of display defects due to writing deficiency of signal voltage can be suppressed, and electrical power consumption when the display panel is driven can be reduced.

The thickness of the second interlayer insulating film 252 is larger than the thickness of the first interlayer insulating film 251, and so similarly to Embodiment 1, a further reduction in electrical power consumption and higher-speed driving of the display device are permitted.

The gate wiring 218b is positioned in the second wiring layer 242, and so a material with a low heat resistance can be used as a material for the gate wiring 218b. Accordingly, examples of the material for the gate wiring 218b include low melting point and low resistance metals (such as Al, Cu, and Ag), and alloys of these metals (for example, aluminum alloy and copper alloy).

Thus, a material with a resistance lower than that of the material for the first wiring layer 241 can be used as a material for the gate wiring 218b. That is, compared with a conventional gate wiring formed from a high melting point metal, the resistance of the gate wiring 218b can be decreased. Accordingly, the width of the gate wiring 218b is decreased, and thereby the aperture ratio can be improved. Further, generation of gate signal delay, due to resistance of the gate wiring 218b, can be suppressed. The reduction in resistance of the gate wiring 218b permits an increase in screen size.

The second interlayer insulating film 252 includes a flattening film, and so similarly to Embodiment 1, a variation in width of the wiring (size of the wiring) and/or generation of a short-circuit can be suppressed in the data wiring 215 and/or the connection part 217c that are/is positioned in the third wiring layer 243.

The third interlayer insulating film 253 includes a flattening film, and so defects such as disconnection, patterning defects, and a short-circuit can be suppressed in the pixel electrode 216, similarly to Embodiment 1. If the display device substrate 2 in the present Embodiment is applied to a liquid crystal display device, a reduction in display qualities, due to a variation in alignment of liquid crystal molecules at the uneven part of the pixel electrode 216 can be suppressed.

The first interlayer insulating film 251 is not a flattening film, and similarly to Embodiment 1, an inorganic insulating film can be used as a material for the first interlayer insulating film 251.

When the main surface of the substrate 210 is viewed in plane, the first contact hole 254a and the through-hole 255a that are connection holes of the first interlayer insulating film 251 and the second interlayer insulating film 252 that are adjacent to each other are arranged at different positions. Accordingly, similarly to Embodiment 1, disconnection and patterning defects of the data wiring 215 can be suppressed.

When the main surface of the substrate 210 is viewed in plane, the contact hole 254b and the through-hole 255b that are connection holes of the first interlayer insulating film 251 and the second interlayer insulating film 252 that are adjacent to each other are arranged at different positions. Accordingly, similarly to Embodiment 1, disconnection and patterning defects of the connection part 217c can be suppressed.

When the main surface of the substrate 210 is viewed in plane, the through-hole 255b and the through-hole 255c that are connection holes of the second interlayer insulating film 252 and the third interlayer insulating film 253 that are adjacent to each other are arranged at different positions. Accordingly, similarly to Embodiment 1, disconnection and patterning defects of the pixel electrode 216 can be suppressed.

When the main surface of the substrate 210 is viewed in plane, the contact hole 254b and the through-hole 255c that are connection holes of the first interlayer insulating film 221 and the third interlayer insulating film 253, which are stacked with the second interlayer insulating film 252 therebetween, are arranged to overlap with each other. Accordingly, as mentioned above, disconnection and patterning defects can be suppressed, and further, an area of the connection hole and the wiring pattern can be decreased as much as possible.

According to the present Embodiment, as shown in FIG. 3, the gate wiring 218a and the data wiring 218b may be extended to an adjacent pixel region. Thus, the gate wirings 218a and 218b are stacked, and so even if each wiring has a disconnection part, the entire of the gate wirings 218a and 218b is not disconnected unless the positions of the disconnection parts overlap with each other. Accordingly, generation of defects due to disconnection of the gate wirings 218a and 218b can be suppressed.

Embodiment 3

FIG. 4 is a schematic view showing a display device substrate in accordance with Embodiment 3. FIG. 4(a) is a plan view thereof. FIG. 4(b) is a cross-sectional view of the substrate taken along line X3-Y3 in FIG. 4(a). FIG. 5 is a plan view schematically showing a gate electrode of a conventional display device substrate. FIG. 6 is a plan view schematically showing a gate wiring in accordance with a modified example of Embodiment 3.

A display device substrate 3 in Embodiment 3 is a substrate for a liquid crystal display device and includes pixels arrayed in a matrix pattern. More specifically, the display device substrate 3 includes, as shown in FIG. 4, on a main surface of a substrate 310, a base layer 311, pixel switching transistors 313a and 313b, a plurality of gate wirings 318, a plurality of storage capacitor wirings 321, a pixel data storage capacitor element 320, a plurality of data wirings 315, connection parts 317a, 317b, 317c, and 317d, a first interlayer insulating film 351 having contact holes 354a, 354b, 354c, and 354d, a second interlayer insulating film 352 having through-holes 355a and 355b, a third interlayer insulating film 353 having a through-hole 355c, and a pixel electrode 316. Thus, the display device substrate 3 is an active matrix substrate.

The display device substrate 3 has, on the main surface of the substrate 310, a structure in which the base layer 311, a semiconductor layer 330, a gate insulating film 312 having contact holes 354a and 354b, a first wiring layer 341, the first interlayer insulating film 351, a second wiring layer 342, the second interlayer insulating film 352, a third wiring layer 343, the third interlayer insulating film 353, and the pixel electrode 316 are stacked in this order from the substrate 310 side. Thus, the contact holes 354a and 354b are connection holes that penetrate the first interlayer insulating film 351 and the gate insulating film 312. The semiconductor layer 330 has channel regions 331a and 331b, low concentration impurity regions 332a, 332b, 332c, 332d, and 332e, and high concentration impurity regions 333a, 333b, and 333c.

A plurality of gate wirings 318 and a plurality of storage capacitor wirings 321 that are arranged parallel to each other are arranged to be perpendicular to a plurality of data wirings 315. That is, the plurality of gate wirings 318, the plurality of storage capacitor wirings 321, and the plurality of data wirings 315 are arranged to form a lattice pattern. A region partitioned by adjacent two storage capacitor wirings 321 and adjacent two data wirings 315 is one pixel region.

Similarly to the transistor 113a in Embodiment 1, the transistor 313a has an LDD structure. The transistor 313a is a top gate TFT that is composed of: the channel region 331a; the low concentration impurity regions 332a and 332b that function as an LDD region; the high concentration impurity regions 333a and 333b that function as a source-drain region; the gate insulating film 312; and the gate electrode 319a. Similarly to the transistor 113b in accordance with Embodiment 1, the transistor 313b also has an LDD structure. The transistor 313b is a top gate TFT composed of: the channel region 331b; the low concentration impurity regions 332c and 332d that function as an LDD region, the high concentration impurity regions 333b and 333c that function as a source-drain region; the gate insulating film 312; and the gate electrode 319a. The transistors 313a and 313b are connected to each other in series through the high concentration impurity region 333b (the source-drain region of the transistors 313a and 313b). This configuration allows generation of leakage current from the pixel electrode 316 to be suppressed. Further, the transistors 313a and 313b are arranged to overlap with the data wiring 315.

The connection part 317a is constituted by the second wiring layer 342 into an island shape to overlap with the high concentration impurity region 333a. The connection part 317b is constituted by the second wiring layer 342 to overlap with the gate electrodes 319a and 319b. The connection part 317c is also constituted by the second wiring layer 342 into an island shape to overlap with the high concentration impurity region 333c and the storage capacitor wiring 321. The connection part 317d is constituted by the third wiring layer 343 into an island shape to overlap with the storage capacitor wiring 321.

The gate wiring 318 is constituted by the second wiring layer 342. The gate wiring 318 and the connection part 317b are integrally constituted by the second wiring layer 242 to be connected to each other. The gate electrodes 319a and 319b are separately (individually) constituted by the first wiring layer 341. The gate electrode 319a and the gate wiring 318 are connected to each other through the contact hole 354c. The gate electrode 319b and the gate wiring 318 are connected to each other through the connection part 317b. The gate electrode 319b and the connection part 317b are connected to each other through the contact hole 354d. The width of the gate electrodes 319a and 319b in the channel length direction is about 4 to 8 µm (preferably 5 to 7 µm). The gate wiring 318 has a width of about 3 to 10 µm (preferably 4 to 6 µm). Thus, the gate wiring 318 of the present Embodiment can be formed to have a width smaller than that of the gate wiring 118 of Embodiment 1.

The data wiring 315 is constituted by the third wiring layer 343. The data wiring 315 is connected to the transistor 313a through the connection part 317a, similarly to Embodiment 1. The contact hole 354a and the through-hole 355a are arranged not to overlap with each other. The width of the data wiring is about 5 to 15 µm (preferably 6 to 10 µm).

The pixel electrode 316 is connected to the transistor 313b through the connection parts 317c and 317d. The pixel electrode 316 and the connection part 317c are connected to each other through the through-hole 355c. The connection parts 317b and 317c are connected to each other through the through-hole 355b. In addition, the connection part 317b and the high concentration impurity region 333c that functions as the source-drain region of the transistor 313b are connected to each other through the contact hole 354b. The contact hole 354b, the contact hole 354b, and the through-hole 355c are arranged not to overlap with one another. The pixel electrode 316 is arranged in a pixel region partitioned by adjacent two storage capacitor wirings 321 and adjacent two data wirings 315.

The pixel data storage capacitor element 320 is composed of a storage capacitor lower electrode 322, a gate insulating film 312, and a storage capacitor wiring 321 (storage capacitor upper electrode 323), similarly to Embodiment 2. The storage capacitor lower electrode 322 is formed in the semiconductor layer 330 and connected to the high concentration impurity region 333c that functions as the source-drain region of the transistor 313b.

A production method of the display device substrate 3 is mentioned below.

The substrate 310 like the substrate 110 in Embodiment 1 is prepared. Then, similarly to Embodiment 1, the base layer 311, the semiconductor layer 330 having an island shape, and the gate insulating film 312, are formed.

In order to control threshold voltages of the transistors 313a and 313b, the entire semiconductor layer 330 is doped with impurity elements such as boron (B), similarly to Embodiment 1.

While the semiconductor layer 330 except for a region that is to constitute the storage capacitor lower electrode 322 is covered with a resist, the semiconductor layer 330 in the region that is to constitute the electrode 322 is doped with an impurity element of phosphorus (P) and the like, similarly to Embodiment 1. As a result, a low concentration impurity region 332e constituting the electrode 322 is formed. Then the resist is removed.

Similarly to Embodiment 1, the first wiring layer 341 is formed. As a result, the gate electrodes 319a and 319b, the gate wiring 318, and the storage capacitor wiring 321 (storage capacitor upper electrode 323) are formed.

Similarly to Embodiment 1, the semiconductor layer 330 is doped with impurities such as phosphorus (P) in a self-alignment manner using the first wiring layer 341 as a mask (low concentration doping). While regions of the semiconductor layer 330 that are to constitute LDD regions of the transistors 313a and 313b are covered with a resist, the semiconductor layer 330 is doped with impurities such as phosphorus (P), similarly to Embodiment 1 (high concentration doping). As a result, the low concentration impurity regions 332a, 332b, 332c, and 332d that function as an LDD region are formed. The high concentration impurity regions 333a and 333b that function as a source-drain region are formed and the high concentration impurity region 333c that functions as a source-drain region or the storage capacitor lower electrode 322 is formed. Then the resist is removed.

Similarly to Embodiment 1, the first interlayer insulating film 351 is formed and the semiconductor layer 330 is hydrogenated and activated. Similarly to the first interlayer insulating film 151 in Embodiment 1, the film 351 is preferably a multi-layer film including a hydrogen-containing silicon nitride (SiN:H) film and a SiO$_2$ film stacked in this order from the first wiring layer 341 side. Then the first interlayer insulating film 351 and the gate insulating film 312 are provided with the contact holes 354a and 354b, and the first interlayer insulating film 351 is provided with contact holes 354c and 354d by photolithography. As a result, a part of the source-drain region of the transistors 313a and 313b is exposed and a part of the gate electrodes 319a and 319b is exposed.

Similarly to Embodiment 1, the second wiring layer 342 is formed. As a result, the gate wiring 318b and the connection parts 317a, 317b, and 317c are formed. The connection part 317a is connected to the source-drain region of the transistor 313a through the contact hole 354a. The connection part 317c is connected to the source-drain region of the transistor 313b through the contact hole 354b. The gate electrode 319a is connected to the gate wiring 318 through the contact hole 354c. Further, the gate electrode 319b is connected to the connection part 317b through the contact hole 354d. After this, a heating treatment does not need to be performed, and so the second wiring layer 342 can be formed from a material with a low melting point. Accordingly, preferable examples of the material for the second wiring layer 342 include low resistance metals such as Al, Cu, and Ag, and alloys or compounds, containing these low resistance metals as a main component, similarly to Embodiment 1.

Similarly to Embodiment 1, the second interlayer insulating film 352 is formed. The second insulating film 352 is a flattening film having a flattening function, similarly to the second interlayer insulating film 152 in Embodiment 1. The thickness of the second interlayer insulating film 352 is set to be larger than the thickness of the first interlayer insulating film 351. Then, the second interlayer insulating film 352 is provided with the through-holes 355a and 355b by photolithography. As a result, parts each of the connection parts 317a and 317b are exposed. The through-hole 355a is formed so as not to overlap with the contact hole 354a, and the through-hole 355b is formed so as not to overlap with the contact hole 354b.

Similarly to Embodiment 1, the third wiring layer 343 is formed. As a result, the data wiring 315 and the connection part 317d are formed. The data wiring 315 is connected to the connection part 317a through a through-hole 255a, and the connection part 317d is connected to the connection part 317c through the through-hole 255b. The third wiring layer 343 can be formed from a low melting point material, similarly to the second wiring layer 342. Accordingly, preferable examples of the material for the third wiring layer 343 include low resistant metals such as Al, Cu, and Ag, and alloys or compounds, containing these low resistant metals as a main component, similarly to Embodiment 1.

Similarly to Embodiment 1, the third interlayer insulating film 353 is formed. The film 353 is a flattening film that has a flattening function as that of the third interlayer insulating film 153 in Embodiment 1. Then, by photolithography, the film 353 is provided with a through-hole 355c. As a result, a part of the connection part 317d is exposed. The through-hole 355c is formed so as not to overlap with the through-hole 355b.

Finally, similarly to Embodiment 1, the pixel electrode 316 is formed. As a result, the pixel electrode 316 and the connection part 317d are connected to each other through the through-hole 355c.

According to the display device substrate 3 of the present Embodiment the data wiring 315 is positioned in the third wiring layer 343. Similarly to Embodiment 1, the wirings can be more flexibly designed.

The data wiring 315 is positioned in the third wiring layer 343; the storage capacitor wiring 321 is positioned in the first wiring layer 341; and the gate wiring 318 is positioned in the second wiring layer 342. As a result, similarly to Embodiment 1, generation of display defects due to writing deficiency of signal voltage can be suppressed, and electrical power consumption during display panel driving can be reduced.

The thickness of the second interlayer insulating film 352 is larger than that of the first interlayer insulating film 351, and so similarly to Embodiment 1, a further reduction in electrical power consumption and higher-speed driving of the display device are permitted.

The gate wiring 318 is positioned in the second wiring layer 342, and so a material with a low heat resistance can be used as a material for the gate wiring 318. Accordingly, examples of the material for the gate wiring 318 include low melting point and low resistance metals (such as Al, Cu, and Ag), and alloys thereof (for example, aluminum alloy and copper alloy).

Thus, a material with a resistance lower than that of the material for the first wiring layer 341 can be used as a material for the gate wiring 318. That is, compared with a conventional gate wiring formed from a high melting point metal, the resistance of the gate wiring 318 can be decreased. Accordingly, the width of the gate wiring 318 is decreased, and thereby the aperture ratio can be improved. Further, generation of gate signal delay, due to resistance of the gate wiring 318, can be suppressed. The reduction in resistance of the gate wiring 318 permits an increase in screen size.

The transistors 313a and 313b overlap with the data wiring 315 when the main surface of the substrate 310 is viewed in plane, which increases the aperture ratio. More specifically, in the conventional display device substrate 11 shown in FIG. 12, the aperture ratio is about 40%, but it is about 50% according to the display device substrate 3 in the present Embodiment.

The gate electrodes 319a and 319b that are constituted by the first wiring layer 351 and separated from each other are connected to each other through the connection part 317b that is constituted by the second wiring layer 352. The connection part 317b overlaps with the data wiring 315 when the main surface of the substrate 310 is viewed in plane, which allows a reduction in areas where the gate electrodes 319a and 319b are to be arranged. As a result, the aperture ratio can be more increased.

In the conventional display device substrate including the data wiring constituted by the second wiring layer, as shown in FIG. 5, when two transistors 1313a and 1313b are arranged just below a data wiring 1315 that is constituted by the second wiring layer, gate electrodes 1319a and 1319b need to be integrally constituted by the first wiring layer, and further, a gate electrode connection part 1626 for connecting the gate electrodes 1319a and 1319b to each other needs to be formed. So, such a conventional display device substrate is disadvantageous in terms of aperture ratio of a pixel. The gate electrodes 1319a and 1319b are connected to each other by being integrally formed with a gate wiring 1318.

The second interlayer insulating film 352 includes a flattening film, and so similarly to Embodiment 1, a variation in width of the wiring (size of the wiring) and/or a short-circuit can be suppressed in the data wiring 315 and/or the connection part 317d that are/is positioned in the third wiring layer 343.

The third interlayer insulating film 353 includes a flattening film, and so generation of defects such as disconnection, patterning defects, and a short-circuit can be suppressed in the pixel electrode 316, similarly to Embodiment 1. If the display device substrate 3 in the present Embodiment is applied to a liquid crystal display device, a reduction in display qualities, due to a variation in alignment of liquid crystal molecules at the uneven part of the pixel electrode 316 can be suppressed.

The first interlayer insulating film 351 is not a flattening film, and similarly to Embodiment 1, an inorganic insulating film can be used as a material for the first interlayer insulating film 351.

When the main surface of the substrate 310 is viewed in plane, the first contact hole 354a and the through-hole 355a that are connection holes of the first interlayer insulating film 351 and the second interlayer insulating film 352 that are adjacent to each other are arranged at different positions.

Accordingly, similarly to Embodiment 1, disconnection and patterning defects of the data wiring 315 can be suppressed.

When the main surface of the substrate 310 is viewed in plane, the contact hole 354b and the through-hole 355b that are connection holes of the first interlayer insulating film 351 and the second interlayer insulating film 352 that are adjacent to each other are arranged at different positions. Accordingly, similarly to Embodiment 1, disconnection and patterning defects of the connection part 317d can be suppressed.

When the main surface of the substrate 310 is viewed in plane, the through-hole 355b and the through-hole 355c that are connection holes of the second interlayer insulating film 352 and the third interlayer insulating film 353 that are adjacent to each other are arranged at different positions. Accordingly, similarly to Embodiment 1, disconnection and patterning defects of the pixel electrode 316 can be suppressed.

The display device substrate 3 of the present Embodiment may include a gate wiring 318a that is constituted by the first wiring layer 341 and a gate wiring 318b that is constituted by the second wiring layer 342, as shown in FIG. 6. A part of the gate wiring 318a functions as the gate electrode 319a, and the gate electrode 319a and the gate wiring 318a are integrally constituted by the first wiring layer 341. The gate wirings 318a and 318b are connected to each other through the contact hole 354c. Thus, the gate wirings 318a and 318b are stacked, and so even if each wiring has a disconnection part, the entire of the gate wirings 318a and 318b is not disconnected unless the positions of the disconnection parts do not overlap with each other. Accordingly, generation of defects due to disconnection of the gate wirings 318a and 318b can be suppressed.

Embodiment 4

FIG. 7 is a schematic view showing a display device substrate in accordance with Embodiment 4. FIG. 7(a) is a plan view thereof. FIG. 7(b) is a cross-sectional view of the substrate taken along line X4-Y4 in FIG. 7(a).

A display device substrate 4 in Embodiment 4 is a substrate for a liquid crystal display device and includes pixels arrayed in a matrix pattern. More specifically, the display device substrate 4 includes, as shown in FIG. 7, on a main surface of a substrate 410, a base layer 411, pixel switching transistors 413a and 413b, a plurality of gate wirings 418, a plurality of storage capacitor wirings 421, a pixel data storage capacitor element 420, a plurality of data wirings 415a and 415b, connection parts 417a and 417b, a first interlayer insulating film 451 having contact holes 454a and 454b, a second interlayer insulating film 452 having through-holes 455a and 455b, a third interlayer insulating film 453 having a through-hole 455c, and a pixel electrode 416. Thus, the display device substrate 4 is an active matrix substrate.

The display device substrate 4 has, on the main surface of the substrate 410, a structure in which the base layer 411, a semiconductor layer 430, a gate insulating film 412 having contact holes 454a and 454b, a first wiring layer 441, the first interlayer insulating film 451, a second wiring layer 442, the second interlayer insulating film 452, a third wiring layer 443, the third interlayer insulating film 453, and the pixel electrode 416 are stacked in this order from the substrate 410 side. Thus, the contact holes 454a and 454b are connection holes that penetrate the first interlayer insulating film 451 and the gate insulating film 412. The semiconductor layer 430 has channel regions 431a and 431b, low concentration impurity regions 432a, 432b, 432c, and 432d, and high concentration impurity regions 433a, 433b, and 433c.

A plurality of gate wirings 418 and a plurality of storage capacitor wirings 421 that are arranged parallel to each other are arranged to be perpendicular to a plurality of data wirings 415a and 415b. That is, the plurality of gate wirings 418, the plurality of storage capacitor wirings 421, and the plurality of data wirings 415a and 415b are arranged to form a lattice pattern. A region partitioned by adjacent two storage capacitor wirings 421 and adjacent two data wirings 415 is one pixel region.

Similarly to the transistor 113a in Embodiment 1, the transistor 413a has an LDD structure. The transistor 413a is a top gate TFT that is composed of: the channel region 431a; the low concentration impurity regions 432a and 432b that function as an LDD region, the high concentration impurity regions 433a and 433b that function as a source-drain region; the gate insulating film 412; and the gate electrode 419a. Similarly to the transistor 113b in accordance with Embodiment 1, the transistor 413b also has an LDD structure. The transistor 413b is a top gate TFT composed of the channel region 431b; the low concentration impurity regions 432c and 432d that function as an LDD region, the high concentration impurity regions 433b and 433c that function as a source-drain region; the gate insulating film 412; and the gate electrode 419b. The transistors 413a and 413b are connected to each other in series through the high concentration impurity region 433b (the source-drain region of the transistors 413a and 413b). This configuration allows generation of leakage current from the pixel electrode 416 to be suppressed.

The gate electrodes 419a and 419b are constituted by the first wiring layer 441. The gate electrode 419b is connected to the gate wiring 418 that is constituted by the first wiring layer 441. A part of the gate wiring 418 functions as the gate electrode 419a. Thus, the gate electrodes 419a and 419b, and the gate wiring 418 are integrally constituted by the first wiring layer 441. The width of the gate electrodes 419a and 419b in the channel length direction is about 2 to 5 µm (preferably 3 to 4 µm). The gate wiring 418 has a width of about 5 to 15 µm (preferably 6 to 10 µm).

The connection part 417a is constituted by the second wiring layer 442 into an island shape to overlap with the high concentration impurity region 433c. The connection part 417b is also constituted by the third wiring layer 443 to have an island shape and to overlap with the high concentration impurity region 433c.

The data wiring 415a is constituted by the third wiring layer 443. The data wiring 415b is constituted by the second wiring layer 422 to overlap with the data wiring 415a. The data wirings 415a and 415b are connected to each other through the through-hole 455a. Thus, the display device substrate 4 of the present Embodiment has, on a main surface of the substrate, a structure of alternative layers of: a plurality of interlayer insulating films; and three or more wiring layers, wherein the display device substrate 4 includes: a first data wiring that is positioned in a third wiring layer from a side of the substrate; and a second data wiring that is connected to the first data wiring and that is positioned in a wiring layer adjacent to the third wiring layer in the stacking direction, specifically, a second or fourth wiring layer from the side of the substrate (preferably the second wiring layer). The data wiring 415b and the high concentration impurity region 433a that functions as the source-drain region of the transistor 413a are connected to each other through the contact hole 454a. The contact hole 454a is arranged not to overlap with the through-hole 455a. The width of the data wiring 415a is about 5 to 15 µm (preferably 6 to 10 µm). The width of the data wiring 415b is about 5 to 15 µm (preferably 6 to 10 µm).

The pixel electrode 416 is connected to the transistor 413b through the connection parts 417a and 417b, similarly to Embodiment 1. The contact hole 454b and the through-hole 455c are arranged to overlap with each other. The contact hole 454b and the through-hole 455c are arranged so as not to overlap with the through-hole 455b. The pixel electrode 416 is arranged in a pixel region partitioned by the adjacent two storage capacitor wirings 421 and adjacent two data wirings 415.

The pixel data storage capacitor element 420 is composed of the storage capacitor lower electrode 422, the gate insulating film 412, and the storage capacitor wiring 421 (a storage capacitor upper electrode 423), similarly to Embodiment 2. The storage capacitor lower electrode 422 is formed in the semiconductor layer 430 and connected to the high concentration impurity region 433c that functions as the source-drain region of the transistor 413b.

A production method of the display device substrate 4 is mentioned below.

The substrate 410 like the substrate 110 in Embodiment 1 is prepared. Then, similarly to Embodiment 1, the base layer 411, the semiconductor layer 430 having an island shape, and the gate insulating film 412, are formed.

In order to control threshold voltages of the transistors 413a and 413b, the entire semiconductor layer 430 is doped with impurity elements such as boron (B), similarly to Embodiment 1.

While the semiconductor layer 430 in a region other than a region that is to constitute the storage capacitor lower electrode 422 is covered with a resist, the semiconductor layer 430 in the region that is to constitute the electrode 422 is doped with impurity elements of phosphorus (P) and the like, similarly to Embodiment 1. As a result, a low concentration impurity region constituting the electrode 422 is formed. Then the resist is removed.

Similarly to Embodiment 1, the first wiring layer 441 is formed. As a result, the gate electrodes 419a and 419b, the gate wiring 418, and the storage capacitor wiring 421 (storage capacitor upper electrode 423) are formed.

Similarly to Embodiment 1, the semiconductor layer 430 is doped with impurities such as phosphorus (P) in a self-alignment manner using the first wiring layer 441 as a mask (low concentration doping). While the semiconductor layer 430 in a region that is to constitute LDD regions of the transistors 413a and 413b is covered with a resist, the semiconductor layer 430 is doped with impurities such as phosphorus (P) similarly to Embodiment 1 (high concentration doping). As a result, the low concentration impurity regions 432a, 432b, 432c, and 432d that function as an LDD region are formed. The high concentration impurity regions 433a and 433b that function as a source-drain region are formed and the high concentration impurity region 433c that functions as a source-drain region or the storage capacitor lower electrode 422 is formed. Then the resist is removed.

Similarly to Embodiment 1, the first interlayer insulating film 451 is formed and the semiconductor layer 430 is hydrogenated and activated. Similarly to the first interlayer insulating film 451, the film 451 is preferably a multi-layer film including a hydrogen-containing silicon nitride (SiN:H) film and a SiO$_2$ film stacked in this order from the first wiring layer 441 side. Then, the first interlayer insulating film 451 and the gate insulating film 412 are provided with the contact holes 454a and 454b by photolithography. As a result, a part of the source-drain region of the transistors 413a and 413b is exposed.

Similarly to Embodiment 1, the second wiring layer 442 is formed. As a result, the date wiring 415b and the connection part 417a are formed. The data wiring 415b and the source-drain region of the transistor 413a are connected to each other through the contact hole 454a, and further, the connection part 417a is connected to the source-drain region of the transistor 413b through the contact hole 454b. After this, a heating treatment does not need to be performed, and so the second wiring layer 442 can be formed from a material with a low melting point. Accordingly, preferable examples of the material for the second wiring layer 442 include low resistant metals such as Al, Cu, and Ag, and alloys or compounds, containing these low resistant metals as a main component, similarly to Embodiment 1.

Similarly to Embodiment 1, the second interlayer insulating film 452 is formed. The second interlayer insulating film 452 is a flattening film having a flattening function, similarly to the second interlayer insulating film 152 in Embodiment 1. The thickness of the second interlayer insulating film 452 is set to be larger than the thickness of the first interlayer insulating film 451. Then, the second interlayer insulating film 452 is provided with the through-holes 455a and 455b by photolithography. As a result, a part of the data wiring 415b and a part of the connection part 417a are exposed. The through-hole 455a is formed so as not to overlap with the contact hole 454a, and the through-hole 455b is formed so as not to overlap with the contact hole 454b.

Similarly to Embodiment 1, the third wiring layer 443 is formed. As a result, the data wiring 415a and the connection part 417b are formed. The data wirings 415a and 415b are connected to each other through the through-hole 455a. The connection parts 417a and 417b are connected through the through-hole 455b. The third wiring layer 443 can be formed from a low melting point material, similarly to the second wiring layer 442. Accordingly, preferable examples of the material for the third wiring layer 443 include low resistant metals such as Al, Cu, and Ag, and alloys or compounds, containing these low resistant metals a main component, similarly to Embodiment 1.

Similarly to Embodiment 1, the third interlayer insulating film 453 is formed. The third interlayer insulating film 453 is a flattening film that has a flattening function as those of the third interlayer insulating film 153 in Embodiment 1. Then, by photolithography, the third interlayer insulating film 453 is provided with a through-hole 455c. As a result, a part of the connection part 417b is exposed. The through-hole 455c is formed so as not to overlap with the through-hole 455b but to overlap with the contact hole 454b.

Finally, similarly to Embodiment 1, the pixel electrode 416 is formed. As a result, the pixel electrode 416 and the connection part 417b are connected to each other through the through-hole 455c.

According to the display device substrate 4 of the present invention, the data wirings 415a and 415b have a two-layer structure, and so even if each wiring has a disconnection part, the entire data wirings 415a and 415b is not disconnected unless the positions of the disconnection parts do not overlaps with each other. Accordingly, generation of defects due to disconnection of the data wirings 415a and 415b can be suppressed.

The second interlayer insulating film 452 includes a flattening film. Similarly to Embodiment 1, in the data wiring 415a and/or the connection part 417d that are/is positioned in the third wiring layer 443, a variation in width of the wiring (size of the wiring) and/or a short-circuit can be suppressed.

The third interlayer insulating film 453 includes a flattening film, and so generation of defects such as disconnection, patterning defects, and a short-circuit can be suppressed in the pixel electrode 416, similarly to Embodiment 1. If the display device substrate 4 in the present Embodiment is applied to a liquid crystal display device, a reduction in display qualities, due to a variation in alignment of liquid crystal molecules at the uneven part of the pixel electrode 416 can be suppressed.

The first interlayer insulating film 451 is not a flattening film, and similarly to Embodiment 1, an inorganic insulating film can be used as a material for the first interlayer insulating film 451.

When the main surface of the substrate 410 is viewed in plane, the first contact hole 454a and the through-hole 455a that are connection holes of the first interlayer insulating film 451 and the second interlayer insulating film 452 that are adjacent to each other are arranged at different positions. Accordingly, similarly to Embodiment 1, generation of disconnection and patterning defects of the data wiring 415a can be suppressed.

When the main surface of the substrate 410 is viewed in plane, the contact hole 454b and the through-hole 455b that are connection holes of the first interlayer insulating film 451 and the second interlayer insulating film 452 that are adjacent to each other are arranged at different positions. Accordingly, similarly to Embodiment 1, generation of disconnection and patterning defects of the connection part 417b can be suppressed.

When the main surface of the substrate 410 is viewed in plane, the through-holes 455b and 455c that are connection holes of the second interlayer insulating film 452 and the third interlayer insulating film 453 that are adjacent to each other are arranged at different positions. Accordingly, similarly to Embodiment 1, generation of disconnection and patterning defects of the pixel electrode 416 can be suppressed.

When the main surface of the substrate 410 is viewed in plane, the contact hole 454b and the through-hole 455c that are connection holes of the first interlayer insulating film 421 and the third interlayer insulating film 453 that stacked with the second interlayer insulating film 452 therebetween are arranged to overlap with each other. Accordingly, as mentioned above, generation of disconnection and patterning defects can be suppressed, and an area where the connection hole and the wiring pattern are arranged can be decreased as much as possible.

Embodiment 5

FIG. 8 is a schematic view showing a display device substrate in accordance with Embodiment 5. FIG. 8(a) is a plan view thereof. FIG. 8(b) is a cross-sectional view of the substrate taken along line X5-Y5 in FIG. 8(a).

A display device substrate 5 in Embodiment 5 is a substrate for a liquid crystal display device and includes pixels arrayed in a matrix pattern. More specifically, the display device substrate 5 includes, as shown in FIG. 8, on one main surface of a substrate 510, a base layer 511, pixel switching transistors 513a and 513b, a plurality of gate wirings 518, a plurality of storage capacitor wirings 521, a pixel data storage capacitor element 520, a plurality of data wirings 515a and 515b, connection parts 517a, 517b, 517c, 517d, and 517e, a first interlayer insulating film 551 having contact holes 554a and 554b, a second interlayer insulating film 552 having through-holes 555a and 555c, a third interlayer insulating film 553 having through-holes 555b and 555d, a fourth interlayer insulating film 554 having a through-hole 555e, and a pixel electrode 516. Thus, the display device substrate 5 is an active matrix substrate.

The display device substrate 5 has, on the main surface of the substrate 510, a structure in which the base layer 511, a semiconductor layer 530, a gate insulating film 512 having contact holes 554a and 554b, a first wiring layer 541, the first interlayer insulating film 551, a second wiring layer 542, the second interlayer insulating film 552, a third wiring layer 543, the third interlayer insulating film 553, a fourth wiring layer 544, the fourth interlayer insulating film 554, and the pixel electrode 516 are stacked in this order from the substrate 510 side. Thus, the contact holes 554a and 554b are connection holes that penetrate the first interlayer insulating film 551 and the gate insulating film 512. The semiconductor layer 530 has channel regions 531a and 531b, low concentration impurity regions 532a, 532b, 532c, and 532d, and high concentration impurity regions 533a, 533b, and 533c.

A plurality of gate wirings 518 and a plurality of storage capacitor wirings 521 that are arranged parallel to each other are arranged to be perpendicular to a plurality of data wirings 515a and 515b. That is, the plurality of gate wirings 518, the plurality of storage capacitor wirings 521, and the plurality of data wirings 515a and 515b are arranged to form a lattice pattern. A region partitioned by adjacent two storage capacitor wirings 521 and adjacent two data wirings 515 is one pixel region.

Similarly to the transistor 113a of Embodiment 1, the transistor 513a has an LDD structure. The transistor 513a is a top gate TFT that is composed of: the channel region 531a; the low concentration impurity regions 532a and 532b that function as an LDD region; the high concentration impurity regions 533a and 533b that function as a source-drain region; the gate insulating film 512; and the gate electrode 519a. Similarly to the transistor 113b in accordance with Embodiment 1, the transistor 513b also has an LDD structure. The transistor 513b is composed of the channel region 531b; the low concentration impurity regions 532c and 532d that function as an LDD region, the high concentration impurity regions 533b and 533c that function as a source-drain region; the gate insulating film 512; and the gate electrode 519b. The transistors 513a and 513b are connected to each other in series through the high concentration impurity region 533b (the source-drain region of the transistors 513a and 513b). This configuration allows generation of leakage current from the pixel electrode 516 to be effectively suppressed.

The gate electrodes 519a and 519b are constituted by the first wiring layer 541. The gate electrode 519b is connected to the gate wiring 518 that is constituted by the first wiring layer 541. A part of the gate wiring 518 functions as the gate electrode 519a. Thus, the gate electrodes 519a and 519b, and the gate wiring 518 are integrally constituted by the first wiring layer 541. The width of the gate electrodes 519a and 519b in the channel length direction is about 2 to 5 µm (preferably 3 to 4 µm). The gate wiring 518 has a width of about 5 to 15 µm (preferably 6 to 10 µm).

The connection part 517a is constituted by the second wiring layer 542 to have an island shape and to overlap with the high concentration impurity region 533a. The connection part 517c is also constituted by the third wiring layer 543 to have an island shape and to overlap with the high concentration impurity region 533a. The connection part 517b is constituted by the second wiring layer 542 to have an island shape and to overlap with the high concentration impurity region 533c. The connection part 517d is also constituted by the third wiring layer 543 to have an island shape and to overlap with the high concentration impurity region 533c. The connection part 517e is also constituted by the fourth wiring layer 544 to have an island shape and to overlap with the high concentration impurity region 533c.

The data wiring 515 is constituted by the fourth wiring layer 543. The data wiring 515 is connected to the transistor 513a through the connection parts 517a and 517c. The data wiring 515 is connected to the connection part 517c through the through-hole 555b. The connection parts 517c and 517a are connected to each other through the through-hole 555a. The connection part 517a is connected to the high concentration impurity region 533a that functions as the source-drain region of the transistor 513a through the contact hole 554a. The contact hole 554a and the through-hole 555b are arranged to overlap with each other. The contact hole 554a and the through-hole 555b are not arranged to overlap with the through-hole 555a. The width of the data wiring 615 is about 5 to 15 μm (preferably 6 to 10 μm).

The pixel electrode 516 is connected to the transistor 513b through the connection parts 517b, 517d, and 517e. The pixel electrode 516 and the connection part 517e are connected to each other through the through-hole 555e. The connection parts 517e and 517d are connected to each other through the through-hole 555d. The connection parts 517d and 517b are connected to each other through the through-hole 555c. The connection part 517b is connected to the high concentration impurity region 533c that functions as the source-drain region of the transistor 513b through the contact hole 554b. The contact hole 554b and the through-hole 555d are arranged to overlap with each other. The through-holes 555c and 555e are arranged to overlap with each other. The contact hole 554b and the through-hole 555d are arranged not to overlap with the through-holes 555c and 555e. The pixel electrode 516 is arranged in a pixel region partitioned by the adjacent two storage capacitor wirings 521 and adjacent two data wirings 515.

The pixel data storage capacitor element 520 is composed of a storage capacitor lower electrode 522, the gate insulating film 512, and the storage capacitor wiring 521 (storage capacitor upper electrode 523), similarly to Embodiment 2. The electrode 522 is formed in the semiconductor layer 530 and connected to the high concentration impurity region 533c that functions as the source-drain region of the transistor 513b.

A production method of the display device substrate 5 is mentioned below.

The substrate 510 like the substrate 110 in Embodiment 1 is produced. Then, similarly to Embodiment 1, the base layer 511, the semiconductor layer 530 having an island shape, and the gate insulating film 512, are formed.

In order to control threshold voltages of the transistors 513a and 513b, the entire semiconductor layer 530 is doped with impurity elements such as boron (B), similarly to Embodiment 1.

While the semiconductor layer 530 in a region other than a region that is to constitute the storage capacitor lower electrode 522 is covered with a resist, the semiconductor layer 530 in the region that is to constitute the electrode 522 is doped with impurity elements of phosphorus (P) and the like, similarly to Embodiment 1. As a result, a low concentration impurity region constituting the electrode 522 is formed. Then the resist is removed.

Similarly to Embodiment 1, the first wiring layer 541 is formed. As a result, the gate electrodes 519a and 519b, the gate wiring 518, and the storage capacitor wiring 521 (storage capacitor upper electrode 523) are formed.

Similarly to Embodiment 1, the semiconductor layer 530 is doped with impurities such as phosphorus (P) in a self-alignment manner using the first wiring layer 541 as a mask (low concentration doping). While the semiconductor layer 530 in regions that are to constitute LDD regions of the transistors 513a and 513b are covered with a resist, the semiconductor layer 530 is doped with impurities such as phosphorus (P) similarly to Embodiment 1 (high concentration doping). As a result, the low concentration impurity regions 532a, 532b, 532c, and 532d that function as an LDD region are formed. The high concentration impurity regions 533a and 533b that function as a source-drain region are formed and the high concentration impurity region 533c that functions as a source-drain region or the storage capacitor lower electrode 522 is formed. Then the resist is removed.

Similarly to Embodiment 1, the first interlayer insulating film 551 is formed and the semiconductor layer 530 is hydrogenated and activated. Similarly to the first interlayer insulating film 151 of Embodiment 1, the film 551 is preferably a multi-layer film including a hydrogen-containing silicon nitride (SiN:H) film and a $SiO_2$ film stacked in this order from the first wiring layer 541 side. Then, the first interlayer insulating film 551 and the gate insulating film 512 are provided with the contact holes 554a and 554b. As a result, a part of the source-drain region of the transistors 513a and 513b is exposed.

Similarly to Embodiment 1, the second wiring layer 542 is formed. As a result, the connection parts 517a and 517b are formed. The connection part 517a is connected to the source-drain region of the transistor 513a through the contact hole 554a. The connection part 517b is connected to the source-drain region of the transistor 513b through the contact hole 554b. After this, a heating treatment does not need to be performed, and so the second wiring layer 542 can be formed from a material with a low melting point. Accordingly, preferable examples of the material for the second wiring layer 542 include low resistance metals such as Al, Cu, and Ag, and alloys or compounds, containing these low resistance metals as a main component, similarly to Embodiment 1.

Similarly to Embodiment 1, the second interlayer insulating film 552 is formed to have a thickness of 1.0 to 3.0 μm (preferably 1.5 to 2.0 μm). The second interlayer insulating film 552 is a flattening film having a flattening function, similarly to the second interlayer insulating film 152 of Embodiment 1. The thickness of the second interlayer insulating film 552 is set to be larger than the thickness of the first interlayer insulating film 551. Then, the second interlayer insulating film 552 is provided with the through-holes 555a and 555c by photolithography. As a result, parts each of the connection parts 517a and 517b are exposed. The through-hole 555a is formed so as not to overlap with the contact hole 554a, and the through-hole 555c is formed so as not to overlap with the contact hole 554b.

Similarly to Embodiment 1, the third wiring layer 543 is formed. As a result, the connection parts 517c and 517d are formed. The connection parts 517c and 517a are connected to each other through the through-hole 555a. The connection parts 517d and 517b are connected to each other through the through-hole 555c. The third wiring layer 543 can be formed from a material with a low melting point, similarly to the second wiring layer 542. Accordingly, preferable examples of the material for the third wiring layer 543 include low resistance metals such as Al, Cu, and Ag, and alloys or compounds, containing these low resistance metals as a main component, similarly to Embodiment 1.

Similarly to Embodiment 1, the third interlayer insulating film 553 is formed to have a thickness of 1.0 to 3.0 μm (preferably 1.5 to 2.0 μm). The third interlayer insulating film 553 is a flattening film having a flattening function like the third interlayer insulating film 153 in Embodiment 1. The thickness of the third interlayer insulating film 553 is set to be larger than the thickness of the first interlayer insulating film 551. Then the third interlayer insulating film 553 is provided with through-holes 555b and 555d by photolithography. As a result, parts each of the connection parts 517c and 517d are exposed. The through-hole 555b is formed so as not to overlap with the through-hole 555a but overlap with the contact hole 554a. The through-hole 555d is formed so as not to overlap with the through-hole 555c but overlap with the contact hole 554b.

Then a conductive film with a thickness of 400 to 1000 nm (preferably 600 to 800 nm) is formed by sputtering, and then, the conductive film is patterned into a desirable shape by photolithography to form a fourth wiring layer 544. As a result, the data wiring 515 and the connection part 517e are formed. The data wiring 515 and the connection part 517c are connected through the through-hole 555b. The connection part 517e and the connection part 517d are connected through the through-hole 555d. The fourth wiring layer 544 can be formed from a material with a low melting point, like the second wiring layer 542. Accordingly, preferable examples of the material for the fourth wiring layer 544 include low resistance metals such as Al, Cu, and Ag, and alloys or compounds, containing these low resistance metals as a main component. The fourth wiring layer 544 may have a structure in which conductive films made of these materials are stacked.

Then the fourth interlayer insulating film 554 with a thickness of 1.0 to 3.0 μm (preferably 1.5 to 2.0 μm) is formed. The fourth interlayer insulating film 554 is formed by applying an insulating layer material by spin coating and the like, and appropriately baking the material. Resin materials, spin-on-glass materials (SOG materials) and the like are preferable as the material for the fourth interlayer insulating film 554, like the second interlayer insulating film 152, the third interlayer insulating film 153, and the like, of Embodiment 1. As a result, the fourth interlayer insulating film 554 surface can be flattened. Thus, the fourth interlayer insulating film 554 is a flattening film having a flattening function. Similarly to the second interlayer insulating film 152, the third interlayer insulating film 153, and the like, of Embodiment 1, from viewpoint of easily forming a connection hole (specifically, through-hole 555e), it is preferable that the resin material and the SOG material have photosensitivity. The fourth interlayer insulating film 554 may have a multi-layer structure in which a plurality of insulating films formed from a resin material and/or a SOG material are stacked. Similarly to the second interlayer insulating film 152, the third interlayer insulating film 153, and the like, of Embodiment 1, the fourth interlayer insulating film 554 may have a multi-layer structure in which an insulating film (flattening film) formed from at least one of a resin material and a SOG material, and an insulating film (for example, an inorganic insulating film) formed by CVD, sputtering and the like, are stacked. It is preferable that the fourth interlayer insulating film 554 has a substantially flat surface. However, the surface may have an uneven part that gives a difference in level of about 500 nm (preferably 200 nm) or less, similarly to the second interlayer insulating film 152, the third interlayer insulating film 153, and the like, of Embodiment 1. If the surface of the fourth interlayer insulating film 554 has an uneven part, it is preferable that a radius of curvature of the uneven part is not smaller than the difference in thickness of the film (the difference in level). Then, the fourth interlayer insulating film 554 is provided with the through-hole 555e by photolithography. As a result, a part of the connection part 517e is exposed. The through-hole 555e is formed so as not to overlap with the contact hole 554b and the through-hole 555d but to overlap with the through-hole 555c.

Finally, similarly to Embodiment 1, the pixel electrode 516 is formed. As a result, the pixel electrode 516 and the connection part 517e are connected to each other through the through-hole 555e.

According to the display device substrate 5 of the present Embodiment, the data wiring 515 is positioned in the fourth wiring layer 544, and thereby the first wiring layer 541, the second wiring layer 542, and the third wiring layer 543 can be used as, for example, the gate wiring 518, the storage capacitor wiring 521, or the electrodes constituting the pixel data storage capacitor element 520. Accordingly, compared with Embodiment 1, the wirings can be more flexibly designed.

The data wiring 515 is positioned in the fourth wiring layer 544, and the gate wiring 518 and the storage capacitor wiring 521 are positioned in the first wiring layer 541. So compared with Embodiment 1, the data wiring 515 can be arranged with a larger distance from the gate wiring 518 and the storage capacitor wiring 521. Accordingly, compared with Embodiment 1, the parasitic capacitance in the data wiring 515 is more reduced, and the time for writing data into a pixel can be more shortened. As a result, generation of display defects due to writing deficiency of signal voltage can be more suppressed, and electrical power consumption when the display panel is driven can be more reduced.

The second interlayer insulating film 552 and the third interlayer insulating film 553 each have a thickness larger than that of the first interlayer insulating film 551, and so the parasitic capacitance in the data wiring 515 can be more effectively reduced. As a result, a further reduction in electrical power consumption and higher-speed driving of the display device are permitted.

The second interlayer insulating film 552 includes a flattening film, and so similarly to Embodiment 1, a variation in width of the wiring (size of the wiring) and/or a short-circuit can be suppressed in the connection parts 517c and/or 517d that are/is positioned in the third wiring layer 543.

The third interlayer insulating film 553 includes a flattening film, and so similarly to Embodiment 1, a variation in width of the wiring (size of the wiring) and/or a short-circuit can be suppressed in the data wiring 515 and/or the connection part 517e that are/is positioned in the fourth wiring layer 544.

The fourth interlayer insulating film 554 includes a flattening film, and so generation of the uneven part of the pixel electrode 516 can be effectively suppressed similarly to Embodiment 1. Accordingly, defects such as disconnection, patterning defects, and a short-circuit of the pixel electrode 516 can be suppressed. If the display device substrate 5 of the present Embodiment is applied to a liquid crystal display device, a reduction in display qualities, due to a variation in alignment of liquid crystal molecules at the uneven part of the pixel electrode 516 can be suppressed.

The first interlayer insulating film 551 is not a flattening film, and so similarly to Embodiment 1, an inorganic insulating film can be used as a material for the first interlayer insulating film 551.

When the main surface of the substrate 510 is viewed in plane, the first contact hole 554a and the through-hole 555a that are connection holes of the first interlayer insulating film 551 and the second interlayer insulating film 552 that are adjacent to each other are arranged at different positions. Accordingly, similarly to Embodiment 1, generation of disconnection and patterning defects of the connection part 517c can be suppressed.

When the main surface of the substrate 510 is viewed in plane, the contact hole 554b and the through-hole 555b that are connection holes of the first interlayer insulating film 551 and the second interlayer insulating film 552 that are adjacent to each other are arranged at different positions. Accordingly, similarly to Embodiment 1, generation of disconnection and patterning defects of the connection part 517d can be suppressed.

When the main surface of the substrate 510 is viewed in plane, the through-holes 555a and 555b that are connection holes of the second interlayer insulating film 552 and the third interlayer insulating film 553 that are adjacent to each other are arranged at different positions. Accordingly, similarly to Embodiment 1, generation of disconnection and patterning defects of the data wiring 515 can be suppressed.

When the main surface of the substrate 510 is viewed in plane, the through-holes 555c and 555d that are connection holes of the second interlayer insulating film 552 and the third interlayer insulating film 553 that are adjacent to each other are arranged at different positions. Accordingly, similarly to Embodiment 1, generation of disconnection and patterning defects of the connection part 517e can be suppressed.

When the main surface of the substrate 510 is viewed in plane, the through-holes 555d and 555e that are connection holes of the third interlayer insulating film 553 and the fourth interlayer insulating film 554 that are adjacent to each other are arranged at different positions. Accordingly, similarly to Embodiment 1, generation of disconnection and patterning defects of the pixel electrode 516 can be suppressed.

When the main surface of the substrate 510 is viewed in plane, the contact holes 554a and the through-hole 555b that are connection holes of the first interlayer insulating film 551 and the third inter layer insulating film 553 that are stacked with the second interlayer insulating film 552 therebetween are arranged to overlap with each other. Accordingly, as mentioned above, generation of disconnection and patterning defects can be suppressed, and further, an area of the connection hole and the wiring pattern can be decreased as much as possible.

When the main surface of the substrate 510 is viewed in plane, the contact holes 554b and the through-hole 555d that are connection holes of the first interlayer insulating film 551 and the third interlayer insulating film 553 that are stacked with the second interlayer insulating film 552 therebetween are arranged to overlap with each other, and further, the through-holes 555c and 555e are arranged to overlap with each other. Accordingly, as mentioned above, disconnection and patterning defects can be suppressed, and further, an area of the connection hole or the wiring pattern can be decreased as much as possible.

Embodiment 6

FIG. 9 is a schematic view showing a wiring substrate in accordance with Embodiment 6. FIG. 9(a) is a plan view thereof. FIG. 9(b) is a cross-sectional view of the substrate taken along line X6-Y6 in FIG. 9(a). FIG. 10 is a cross-sectional view schematically showing the wiring substrate taken along line X7-Y7 in FIG. 9(a).

The wiring substrate 6 in accordance with Embodiment 6 is a substrate for a liquid crystal display device and includes an inverter circuit that is arranged in a peripheral circuit of a liquid crystal display device. Accordingly, the wiring substrate 6 is also a circuit board. More specifically, as shown in FIGS. 9 and 10, the wiring substrate 6 includes, on a main surface of the substrate 610, a base layer 611, an N-channel thin film transistor (Nch-TFT) 624, a P-channel thin film transistor (Pch-TFT) 625, a low-voltage power supply wiring $V_{ss}$, a high-voltage power supply wiring $V_{dd}$, an input voltage wiring $V_{in}$, an output voltage wiring $V_{out}$, connection parts 617a, 617b, and 617c, a first interlayer insulating film 651 having contact holes 654a, 654b, 654c, 654d, 654e, 654f, 654g, 654h, 654i, 654j, 654k, 654l, and 654m, a second interlayer insulating film 652 having through-holes 655a and 655b, a third interlayer insulating film 653 having a through-hole 655c, and a fourth interlayer insulating film 654. Thus, the wiring substrate 6 includes a CMOS transistor.

The wiring substrate 6 has, on the main surface of the substrate 610, a structure in which the base layer 611, semiconductor layers 630a and 630b, the gate insulating film 612 having the contact holes 654a, 654b, 654c, 654d, 654e, 654f, 654g, 654h, 654i, 654j, 654k, and 654l, a first wiring layer 641, the first interlayer insulating film 651, a second wiring layer 642, the second interlayer insulating film 652, a third wiring layer 643, the third interlayer insulating film 653, a fourth wiring layer 644, and the fourth interlayer insulating film 654, stacked in this order from the substrate 610 side. Thus, the contact holes 654a, 654b, 654c, 654d, 654e, 654f, 654g, 654h, 654i, 654j, 654k, and 654l are connection holes that penetrate the first interlayer insulating film 651 and the gate insulating film 612. The semiconductor layer 630a has a channel region 631a, low concentration impurity regions 632a and 632b, and high concentration impurity regions 633a and 633b. The semiconductor layer 630b has a channel region 631b and high concentration impurity regions 633c and 633d.

The Nch-TFT 624 is composed of the channel region 631a, the low concentration impurity regions 632a and 132b, the high concentration impurity regions 633a and 633b, the gate insulating film 612, and the gate electrode 619a. Thus, the Nch-TFT 624 has a GOLD (gate overlapped LDD) structure. The low concentration impurity regions 632a and 632b function as an LDD region. The high concentration impurity region 633a functions as a source region. The high concentration impurity region 633b functions as a drain region. The Pch-TFT 625 is composed of the channel region 631b, the high concentration impurity regions 633c and 633d, the gate insulating film 612, and the gate electrode 619b. Thus, the Pch-TFT 625 has a single drain structure. The high concentration impurity region 633d functions as a source region. The high concentration impurity region 633c functions as a drain region. The Nch-TFT 624 and Pch-TFT 625 are top gate (planar) thin film transistors (TFTs).

The gate electrodes 619a and 619b are positioned in the first wiring layer 641. The gate electrodes 619a and 619b are connected to each other through a gate electrode connection part 626 that is constituted by the first wiring layer 641. The gate electrode connection part 626 is a connection part for connecting the gate electrode 619a to the gate electrode 619b. Thus, the gate electrodes 619a and 619b, and the gate electrode connection part 626 are integrally constituted by the first wiring layer 641. Each of the gate electrodes 619a and 619b has a width in the channel length direction of about 1 to 10 μm. The gate electrode connection part 626 also has a width of about 1 to 10 μm.

The connection part 617a is constituted by the second wiring layer 642 to have an island shape and to overlap with the high concentration impurity regions 633b and 633c. The connection part 617b is constituted by the second wiring layer 642 to have an island shape and to overlap with the gate electrode connection part 626. The connection part 617c is formed from the third wiring layer 643 to have an island shape and to overlap with the gate electrode connection part 626.

The input voltage wiring $V_{in}$ is constituted by the fourth wiring layer 644. The input voltage wiring $V_{in}$ is connected to the gate electrodes 619a and 619b, and the gate electrode connection part 626 through the connection parts 617b and 617c. The input voltage wiring $V_{in}$ and the connection part 617c are connected to each other through the through-hole 655c. The connection parts 617c and 617b are connected to each other through the through-hole 655b. The connection part 617b and the gate electrode connection part 626 are connected to each other through the contact hole 654m. The contact hole 654m and the through-hole 655c are arranged to overlap with each other. The contact hole 654m and the through-hole 655c are arranged not to overlap with the through-hole 655b. The width of the input voltage wiring $V_{in}$ is about 1 to 10 µm (preferably 2 to 4 µm).

The low-voltage power supply wiring $V_{ss}$ is constituted by the second wiring layer 642. The low-voltage power supply wiring $V_{ss}$ and the source region (high concentration impurity region 633a) of the Nch-TFT 624 are connected to each other through the contact holes 654a, 654b, and 654c. The width of the low-voltage power supply wiring $V_{ss}$ is about 5 to 20 µm (preferably 8 to 10 µm).

The high-voltage power supply wiring $V_{dd}$ is constituted by the second wiring layer 642. The high voltage power supply wiring $V_{dd}$ and the source region (high concentration impurity region 633d) of the Pch-TFT 625 are connected to each other through the contact holes 654j, 654k, and 654l. The width of the high voltage power supply wiring $V_{dd}$ is about 5 to 20 µm (preferably 8 to 10 µm).

The output voltage wiring $V_{out}$ is constituted by the third wiring layer 643. The output voltage wiring $V_{out}$ is connected to the drain region (high concentration impurity region 633b) of the Nch-TFT 624 and to the drain region (high concentration impurity region 633c) of the Pch-TFT 625 through the connection part 617a. The output voltage wiring $V_{out}$ and the connection part 617a are connected to each other through the through-hole 655a. The drain region of the Nch-TFT 624 and the connection part 617a are connected to each other through the contact holes 654d, 654e, and 654f. The drain region of the Pch-TFT 625 and the connection part 617a are connected to each other through the contact holes 654g, 654h, and 654i. Thus, the drain region (high concentration impurity region 633b) of the Nch-TFT 624 and the drain region (high concentration impurity region 633c) of the Pch-TFTF 625 are connected to each other through the connection part 617a. The through-hole 655a is arranged not to overlap with the contact holes 654d, 654e, 654f, 654g, 654h, and 654i. The width of the output voltage wiring $V_{out}$ is about 1 to 10 µm (preferably 2 to 4 µm).

A production method of the wiring substrate 6 is mentioned below.

The substrate 610 like the substrate 110 in Embodiment 1 is produced. Then, similarly to Embodiment 1, the base layer 611 is formed.

Then, the semiconductor layers 630a and 630b are formed into an island shape to have a thickness of 30 to 100 nm (preferably 40 to 50 nm). More specifically, the semiconductor layers 630a and 630b are formed as follows: an amorphous semiconductor film having an amorphous structure is formed by publicly known means (sputtering, LPCVD, plasma CVD, and the like); this amorphous semiconductor film is crystallized by a publicly known crystallization treatment (e.g., laser crystallization, thermal crystallization, for example, using a catalyst such as nickel); and the obtained crystal semiconductor film is patterned into a desired shape by photolithography. The material for the semiconductor layers 630a and 630b is not especially limited, and preferably is silicon, an alloy of silicon and germanium (SiGe), and the like.

Similarly to Embodiment 1, a gate insulating film 612 with a thickness of 30 to 100 nm (preferably 50 to 70 nm) is formed. In order to control threshold voltages of the transistors 624 and 625, ions of an impurity element such as boron (B) ions are implanted into the entire semiconductor layers 630a and 630b at 50 kV and a dose of $5 \times 10^{12}$ to $3 \times 10^{13}$ cm$^{-2}$. The concentration of the impurity element in the semiconductor layers 630a and 630b is about $5 \times 10^{16}$ to $5 \times 10^{17}$ cm$^{-3}$.

While the channel region 631a of the semiconductor layer 630a and the semiconductor layer 630b are covered with a resist, ions of an impurity element such as phosphorus (P) ions are implanted into the semiconductor layer 630a at 70 kV and a dose of $1 \times 10^{13}$ to $1 \times 10^{14}$ cm$^{-2}$ (low concentration doping). The concentration of the impurity element in the semiconductor layer 630a is about $1 \times 10^{17}$ to $1 \times 10^{18}$ cm$^{-3}$. Then the resist is removed.

Similarly to Embodiment 1, the first wiring layer 641 is formed to have a thickness of 200 to 600 nm (preferably 300 to 400 nm) is formed. As a result, the gate electrodes 619a and 619b, and the gate electrode connection part 626 are formed.

Then using the first wiring layer 641 as a mask, ions of an impurity element such as phosphorus (P) ions are implanted into the semiconductor layers 630a and 630b in a self-alignment manner at 50 kV and a dose of $5 \times 10^{15}$ to $1 \times 10^{16}$ cm$^{-2}$ (high concentration doping). The concentration of the impurity element in the semiconductor layers 630a and 630b is about $1 \times 10^{19}$ to $1 \times 10^{20}$ cm$^{-3}$. As a result, the high concentration impurity regions 633a, 633b, 633c, and 633d that function as a source or drain region are formed. In a region facing the end of the gate electrode 619a, the low concentration impurity regions 632a and 632b that function as an LDD region are formed. Then the resist is removed.

Similarly to Embodiment 1, the first interlayer insulating film 651 with a thickness of 0.5 to 1.5 µm (preferably 0.7 to 1.0 µm) is formed and the semiconductor layers 630a and 630b are hydrogenated and activated. Similarly to the first interlayer insulating film 151 of Embodiment 1, the film 651 is preferably a multi-layer film including a hydrogen-containing silicon nitride (SiN:H) film and a $SiO_2$ film stacked in this order from the first wiring layer 641 side. Then, the first interlayer insulating film 651 and the gate insulating film 612 are provided with the contact holes 654a, 654b, 654c, 654d, 654e, 654f, 654g, 654h, 654i, 654j, 654k, 654l, and 654m. As a result, a part of the source and drain regions of the Nch-TFT 624 and the Pch-TFT 625 and a part of the gate electrode connection part 626 are exposed.

Similarly to Embodiment 1, the second wiring layer 642 is formed to have a thickness of 400 to 1000 nm (preferably 600 to 800 nm). As a result, the low-voltage power supply wiring $V_{ss}$, the high voltage power supply wiring $V_{dd}$, the connection parts 617a and 617b are formed. The low-voltage power supply wiring $V_{ss}$ and the source region of the Nch-TFT 624 are connected to each other through the contact holes 654a, 654b, and 654c. The high voltage power supply wiring $V_{dd}$ and the source region of the Pch-TFT 625 are connected to each other through the contact holes 654j, 654k, and 654l. The connection part 617a is connected to the drain regions of the Nch-TFT 624 and the Pch-TFT 625 through the contact holes 654d, 654e, 654f, 654g, 654h, and 654i. The connection part 617b is connected to the gate electrode connection part 626 through the contact hole 654m. After this, a heating treatment does not need to be performed, and so the second wiring layer 642 can be formed from a material with a low melting point. Accordingly, preferable examples of the material for the second wiring layer 642 include low resistance metals such as Al, Cu, and Ag, and alloys or compounds, containing these low resistance metals as a main component, similarly to Embodiment 1.

Similarly to Embodiment 1, the second interlayer insulating film 652 is formed to have a thickness of 1.0 to 3.0 µm (preferably 1.5 to 2.0 µm). The second interlayer insulating film 652 is a flattening film having a flattening function, like the second interlayer insulating film 152 of Embodiment 1. The thickness of the second interlayer insulating film 652 is set to be larger than the thickness of the first interlayer insulating film 651. Then, the second interlayer insulating film 652 is provided with the through-holes 655a and 655b by photolithography. As a result, a part of the connection part 617a and a part of the connection part 617b are exposed. The through-hole 655a is formed so as not to overlap with the contact holes 654d, 654e, 654f, 654g, 654h, and 654i. The through-hole 655b is formed so as not to overlap with the contact hole 654m.

Similarly to Embodiment 1, the third wiring layer 643 with a thickness of 400 to 1000 nm (preferably 600 to 800 nm) is formed. As a result, the output voltage wiring $V_{out}$ and the connection part 617c are formed. The output voltage wiring $V_{out}$ is connected to the connection part 617a through the through-hole 655a. The connection parts 617c and 617b are connected to each other through the through-hole 655b. The third wiring layer 643 can be formed from a low melting point material, similarly to the second wiring layer 642. Accordingly, preferable examples of the material for the third wiring layer 643 include low resistance metals such as Al, Cu, and Ag, and alloys or compounds, containing these low resistance metals as a main component, similarly to Embodiment 1.

Similarly to Embodiment 1, the third interlayer insulating film 653 is formed to have a thickness of 1.0 to 3.0 μm (preferably 1.5 to 2.0 μm). The third interlayer insulating film 653 is a flattening film having a flattening function like the third interlayer insulating film 153 of Embodiment 1. The thickness of the third interlayer insulating film 653 is set to be larger than the thickness of the first interlayer insulating film 651 of Embodiment 1. Then the third interlayer insulating film 653 is provided with the through-hole 655c by photolithography. As a result, a part of the connection part 617c is exposed. The through-hole 655c is formed so as not to overlap with the through-hole 655b but to overlap with the contact hole 654m.

Similarly to Embodiment 5, the fourth wiring layer 644 is formed to have a thickness of 400 to 1000 nm (preferably 600 to 800 nm). As a result, an input voltage wiring $V_{in}$ is formed. The input voltage wiring $V_{in}$ is connected to the connection part 617c through the through-hole 655c. The fourth wiring layer 644 can be formed from a low melting point material, similarly to the second wiring layer 642. Accordingly, preferable examples of the material for the fourth wiring layer 644 include low resistance metals such as Al, Cu, and Ag, and alloys or compounds, containing these low resistance metals as a main component, similarly to Embodiment 5.

Similarly to Embodiment 5, the fourth interlayer insulating film 654 is formed to have a thickness of 1.0 to 3.0 μm (preferably 1.5 to 2.0 μm). The fourth interlayer insulating film 654 is a flattening film having a flattening function, like the fourth interlayer insulating film 554 in accordance with Embodiment 5.

According to the wiring substrate 6 of the present Embodiment, when the main surface of the substrate 610 is viewed in plane, the contact holes 654d, 654e, 654f, 654g, 654h, and 654i, and the though-hole 655a that are connection holes of the first interlayer insulating film 651 and the second interlayer insulating film 652 that are adjacent to each other are arranged at different positions. Accordingly, similarly to Embodiment 1, generation of disconnection and patterning defects of the connection part 617a can be suppressed.

When the main surface of the substrate 610 is viewed in plane, the contact hole 654m and the through-hole 655b that are connection holes of the first interlayer insulating film 651 and the second interlayer insulating film 652 that are adjacent to each other are arranged at different positions. Accordingly, similarly to Embodiment 1, generation of disconnection and patterning defects of the connection part 617c can be suppressed.

When the main surface of the substrate 610 is viewed in plane, the through-hole 655b and the through-hole 655c that are connection holes of the second interlayer insulating film 652 and the third interlayer insulating film 653 that are adjacent to each other are arranged at different positions. Accordingly, similarly to Embodiment 1, generation of disconnection and patterning defects of the input voltage wiring $V_{in}$ can be suppressed.

When the main surface of the substrate 610 is viewed in plane, the contact hole 654m and the through-hole 655c that are connection holes of the first interlayer insulating film 651 and the third interlayer insulating film 653 that are stacked with the second interlayer insulating film 652 therebetween are arranged to overlap with each other. Accordingly, as mentioned above, generation of disconnection and patterning defects can be suppressed, and further, an area where the connection hole and the wiring pattern are arranged can be minimized.

The second interlayer insulating film 652 and the third interlayer insulating film 653 each have a thickness larger than that of the first interlayer insulating film 651, and so the parasitic capacitance in the input voltage wiring $V_{in}$ and the output voltage wiring $V_{out}$ can be more effectively reduced. As a result, a further reduction in electrical power consumption and higher-speed driving of the display device are permitted.

The second interlayer insulating film 652 includes a flattening film, and so similarly to Embodiment 1, a variation in width of the wiring (size of the wiring) and/or a short-circuit can be suppressed in the output voltage wiring $V_{out}$ and/or the connection part 617c that are/is positioned in the third wiring layer 643.

The third interlayer insulating film 653 includes a flattening film, and so similarly to Embodiment 1, a variation in width of the wiring (size of the wiring) and/or a short-circuit can be suppressed in the input voltage wiring $V_{in}$ that is positioned in the fourth wiring layer 644.

The first interlayer insulating film 651 is not a flattening film, and so similarly to Embodiment 1, an inorganic insulating film can be used as a material for the first interlayer insulating film 651.

The gate electrodes 619a and 619b and the gate electrode connection part 626; the low-voltage power supply wiring $V_{ss}$ and the high-voltage power supply wiring $V_{dd}$; the output voltage wiring $V_{out}$; and the input voltage wiring $V_{in}$, are arranged in different wiring layers. So the circuit can be more flexibly designed, and the area where the wiring is arranged can be decreased. As a result, the frame region of the display device can be decreased.

In Embodiment 6, the combination between the electrode and the wiring layer connected thereto is not especially limited.

The wiring substrate 6 may be applied to, for example, a shift register circuit, a level shifter circuit, a latch circuitry, a power supply circuit, etc., in addition to an inverter circuit.

The present invention is mentioned in detail with reference to Embodiments 1 to 6. Embodiments 1 to 6 may be appropriately employed in combination. For example, a combination of Embodiments 1 and 2 can provide a display device substrate 7 shown in FIG. 11. FIG. 11 is a plan view schematically showing a display device substrate obtained by a combination of Embodiments 1 and 2. That is, as shown in FIG. 11, the display device substrate 7 includes, on a main surface of the substrate, pixel switching transistors 113a and 113b, a plurality of gate wirings 218a and 218b, a plurality of storage capacitor wirings 121, a pixel data storage capacitor element 120, a plurality of data wirings 115, connection parts 117a, 117b, and 117c, a first interlayer insulating film 151 having contact holes 154a, 154b, 154c, and 254c, a second interlayer insulating film 152 having through-holes 155a and 155b, and a third interlayer insulating film 153 having a through-hole 155c. The display device substrate 7 exhibits all advantages mentioned in Embodiments 1 and 2.

It is preferable that the display device of the present invention includes the configuration mentioned in Embodiments 1 to 5 in a display region (each pixel region) and includes the configuration mentioned in Embodiment 6 in a frame region (outside the display region), specifically, in the peripheral circuit. As a result, the display device that can exhibit the advantages in Embodiments 1 to 6 can be produced. In this case, through the step of forming the display region and the step of forming the peripheral circuit, such a display device can be easily produced.

The present application claims priority to Patent Application No. 2007-114543 filed in Japan on Apr. 24, 2007 under the Paris Convention and provisions of national law in a designated State, the entire contents of which are hereby incorporated by reference.

BRIEF DESCRIPTION OF DRAWINGS

FIG. 1(a) is a plan view thereof. FIG. 1(b) is a cross-sectional view of the substrate taken along line X1-Y1 in FIG. 1(a).

FIG. 2(a) is a plan view thereof. FIG. 2(b) is a cross-sectional view of the substrate taken along line X2-Y2 in FIG. 2(a).

FIG. 4(a) is a plan view thereof. FIG. 4(b) is a cross-sectional view of the substrate taken along line X3-Y3 in FIG. 4(a).

FIG. 7(a) is a plan view thereof. FIG. 7(b) is a cross-sectional view of the substrate taken along line X4-Y4 in FIG. 7(a).

FIG. 8(a) is a plan view thereof. FIG. 8(b) is a cross-sectional view of the substrate taken along line X5-Y5 in FIG. 8(a).

FIG. 9(b) is a plan view thereof. FIG. 9(b) is a cross-sectional view of the substrate taken along line X6-Y6 in FIG. 9(a).

FIG. 12(a) is a plan view thereof. FIG. 12(b) is a cross-sectional view of the substrate taken along line X8-Y8 in FIG. 12(a).

EXPLANATION OF NUMERALS AND SYMBOLS

Figure 1:
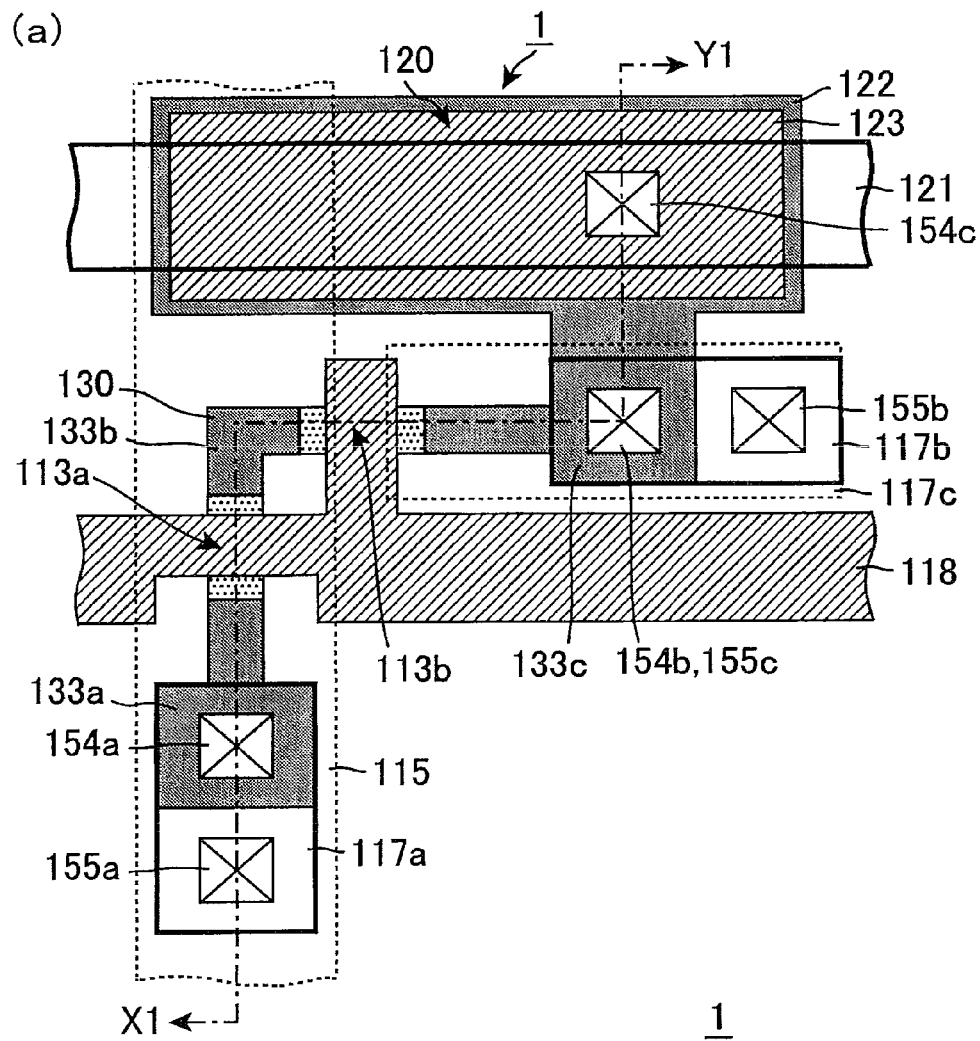
FIG. 1 is a schematic view showing the display device substrate in accordance with Embodiment 1.
Figure 1:
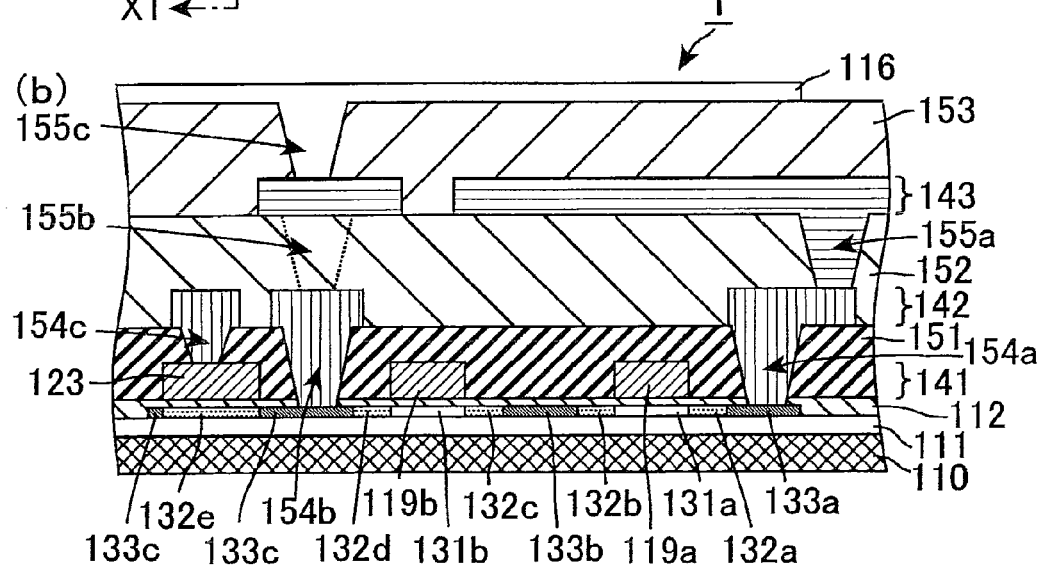
Figure 2:
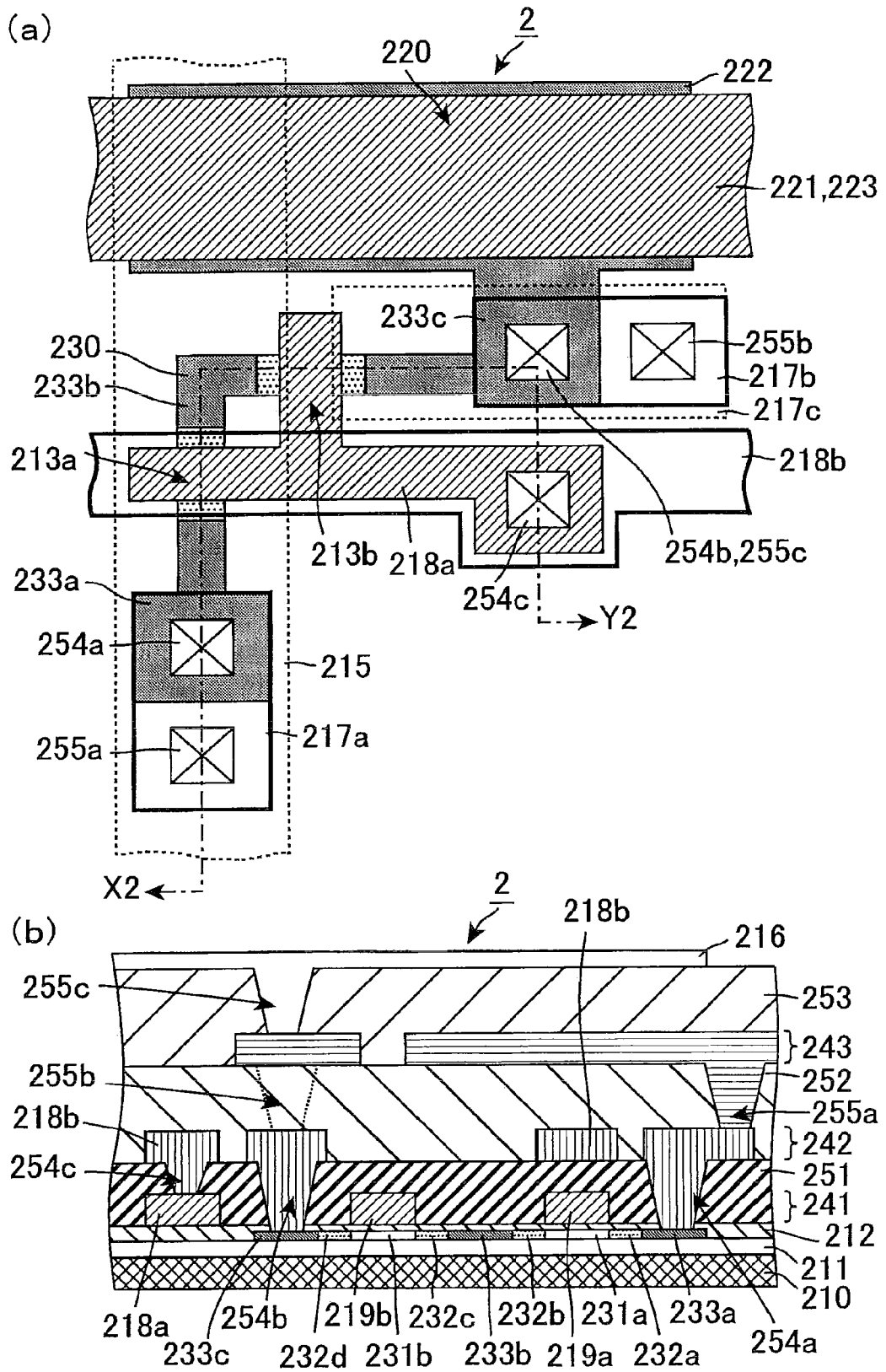
FIG. 2 is a schematic view showing the display device substrate in accordance with Embodiment 2.
Figure 3:
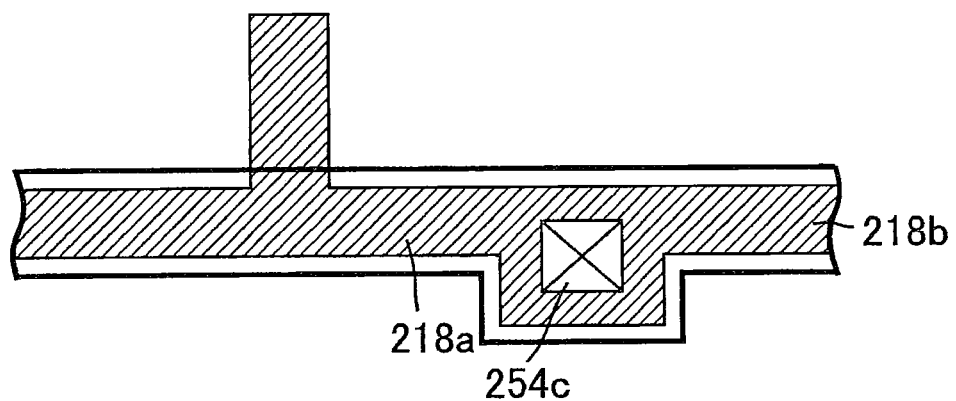
FIG. 3 is a plan view schematically showing the gate wiring in accordance with a modified example of Embodiment 2.
Figure 4:
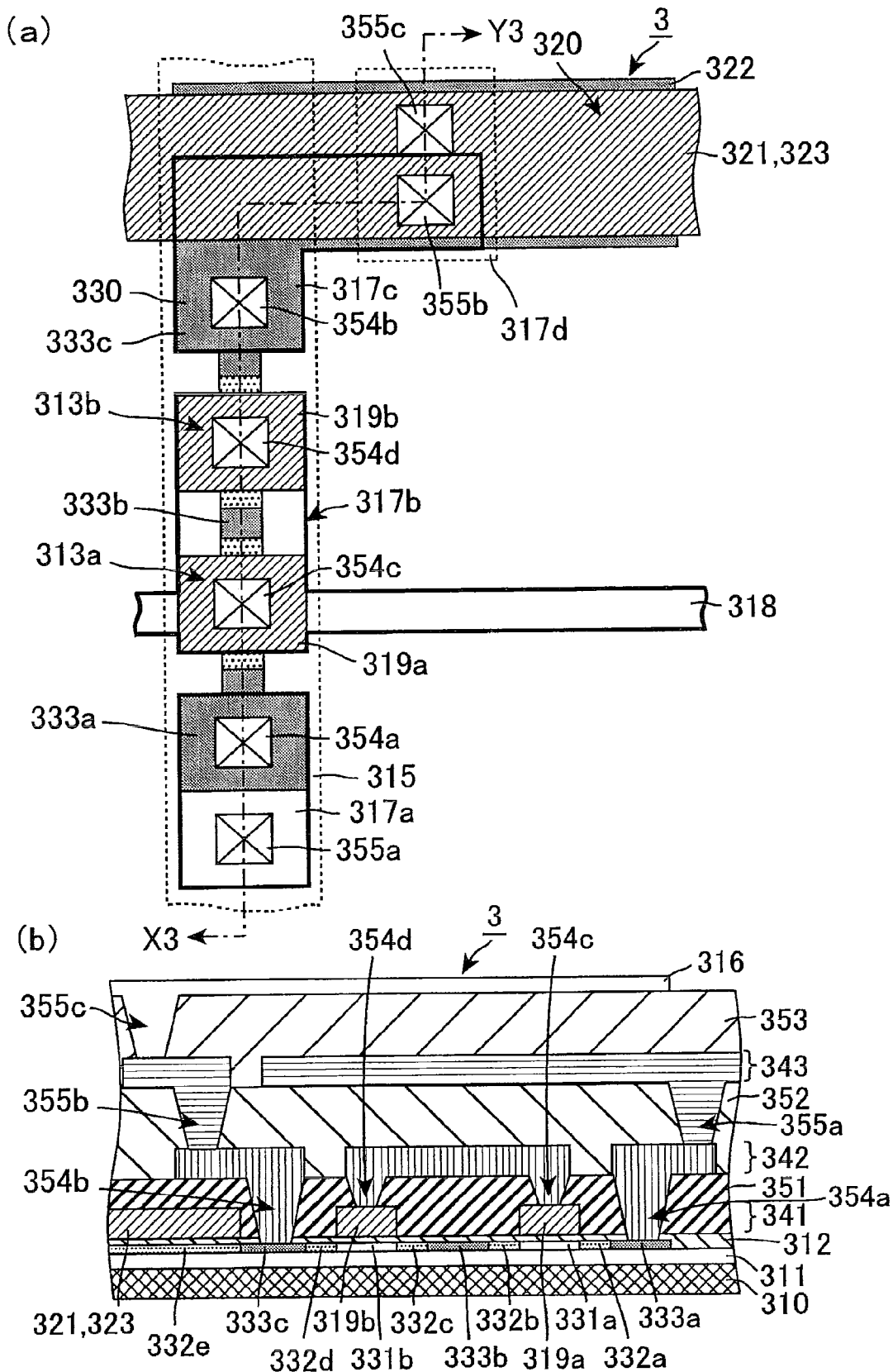
FIG. 4 is a schematic view showing the display device substrate in accordance with Embodiment 3.
Figure 5:
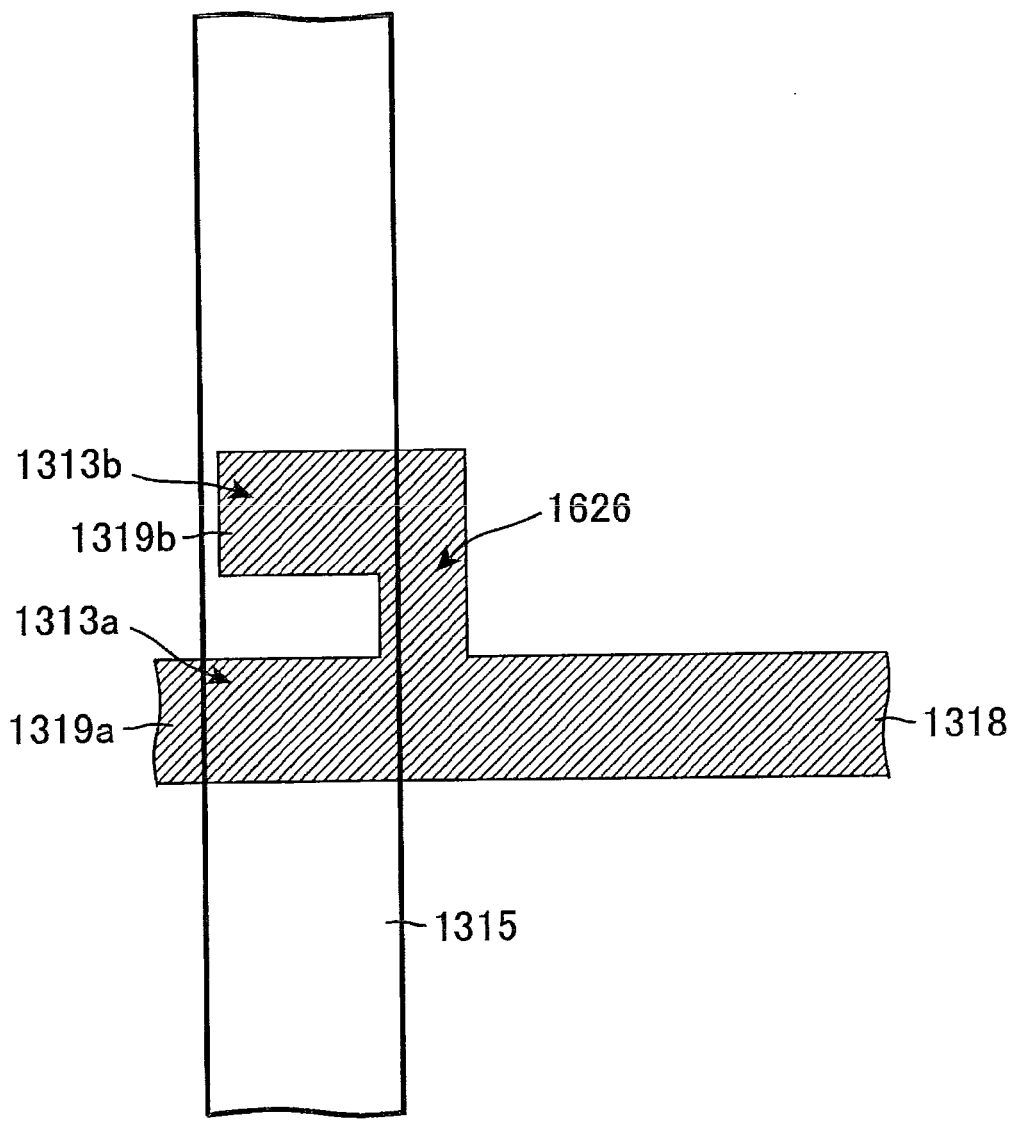
FIG. 5 is a plan view schematically showing an embodiment of a gate electrode in a conventional display device substrate.
Figure 6:
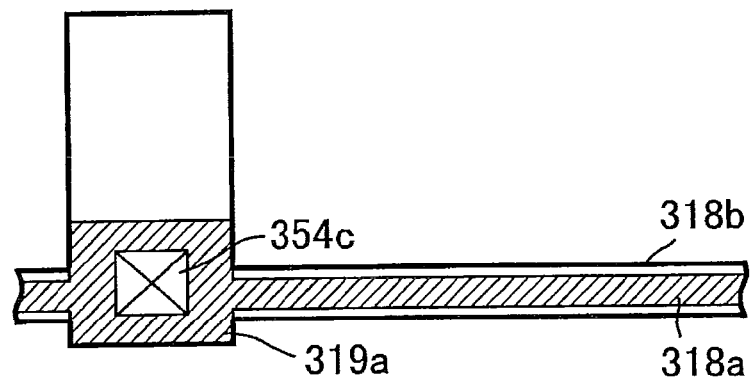
FIG. 6 is a plan view schematically showing the gate wiring in accordance with a modified example of Embodiment 3.
Figure 7:
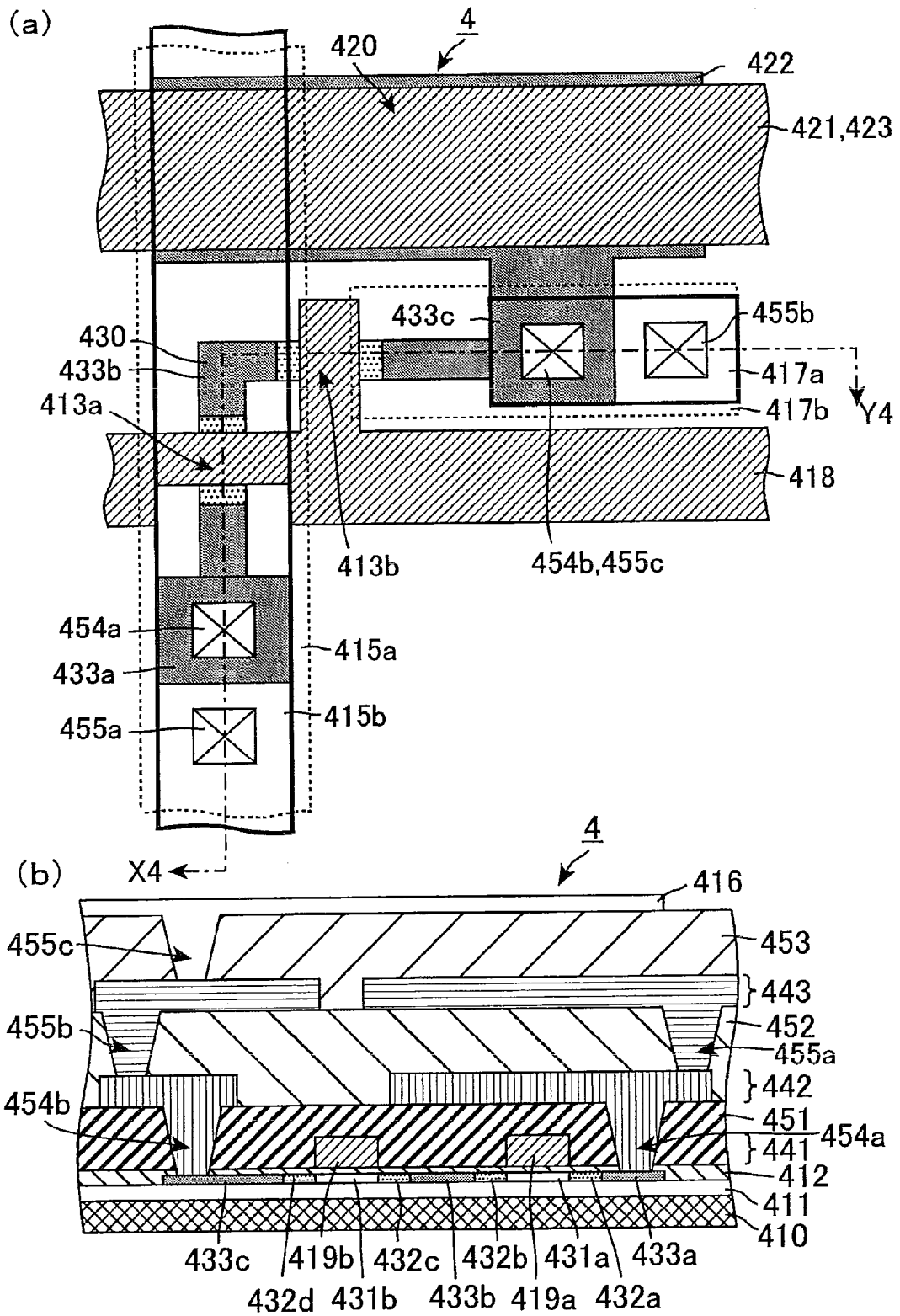
FIG. 7 is a schematic view showing the display device substrate in accordance with Embodiment 4.
Figure 8:
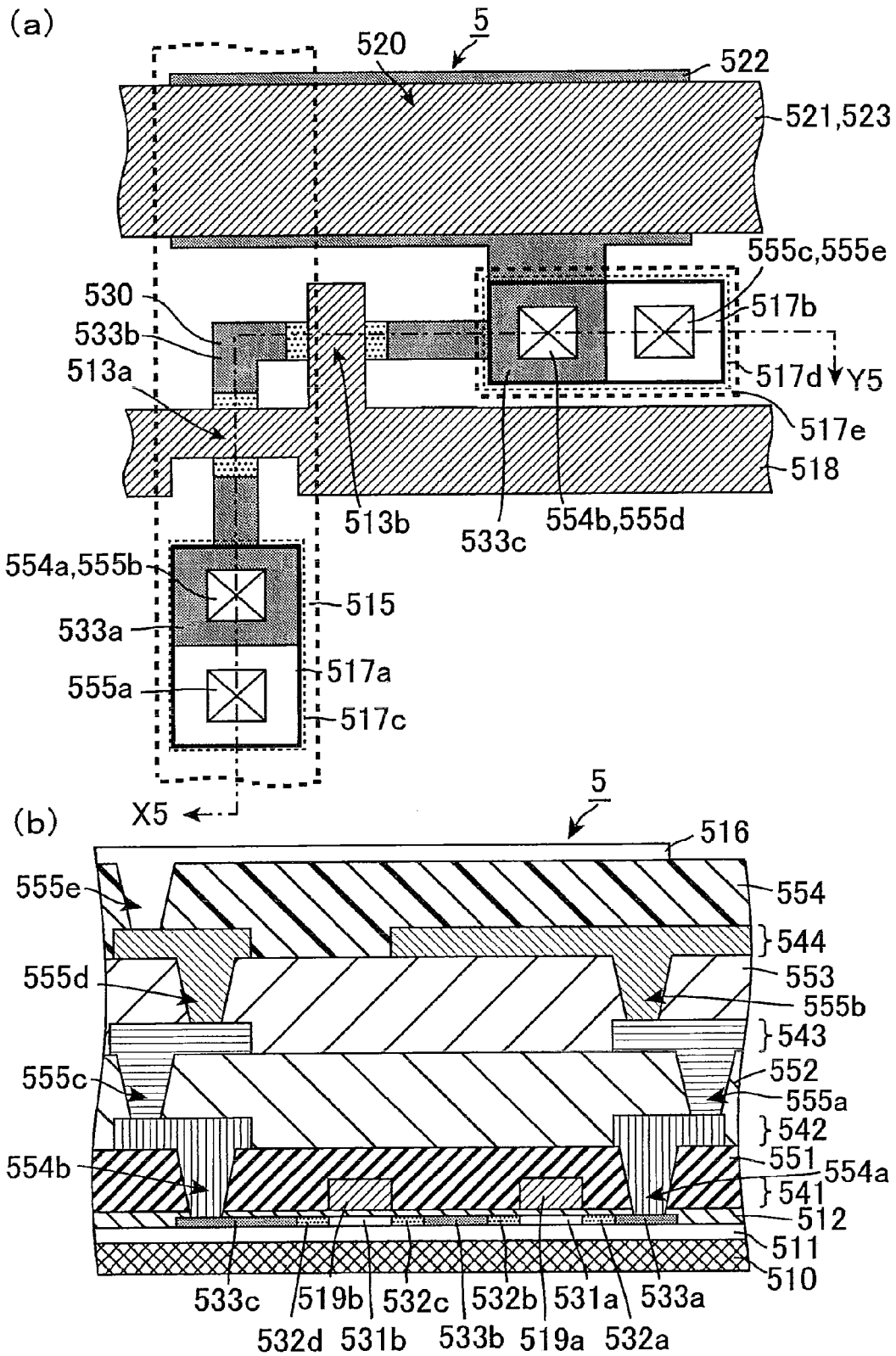
FIG. 8 is a schematic view showing the display device substrate in accordance with Embodiment 5.
Figure 9:
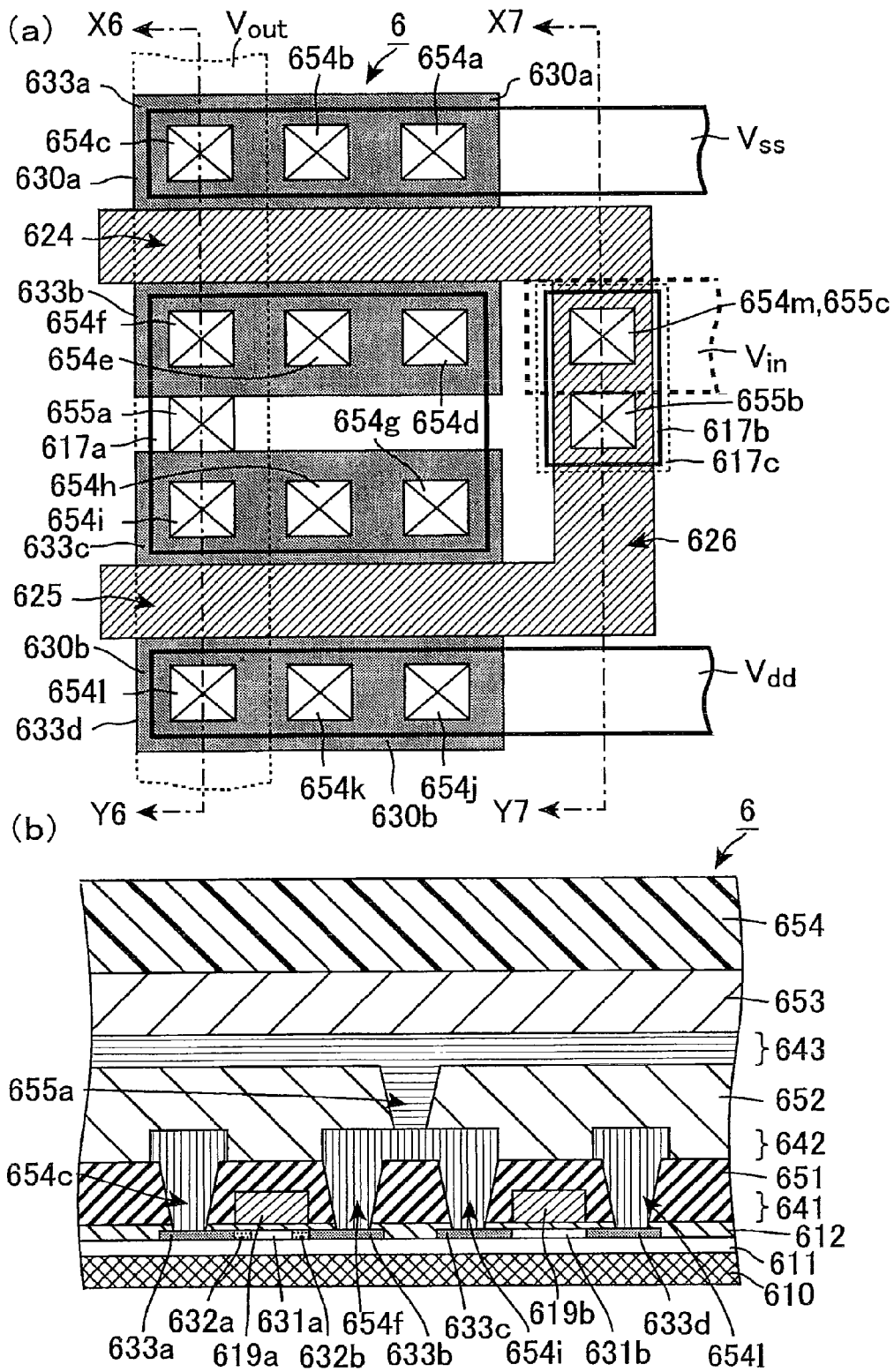
FIG. 9 is a schematic view showing the wiring substrate in accordance with Embodiment 6.
Figure 10:
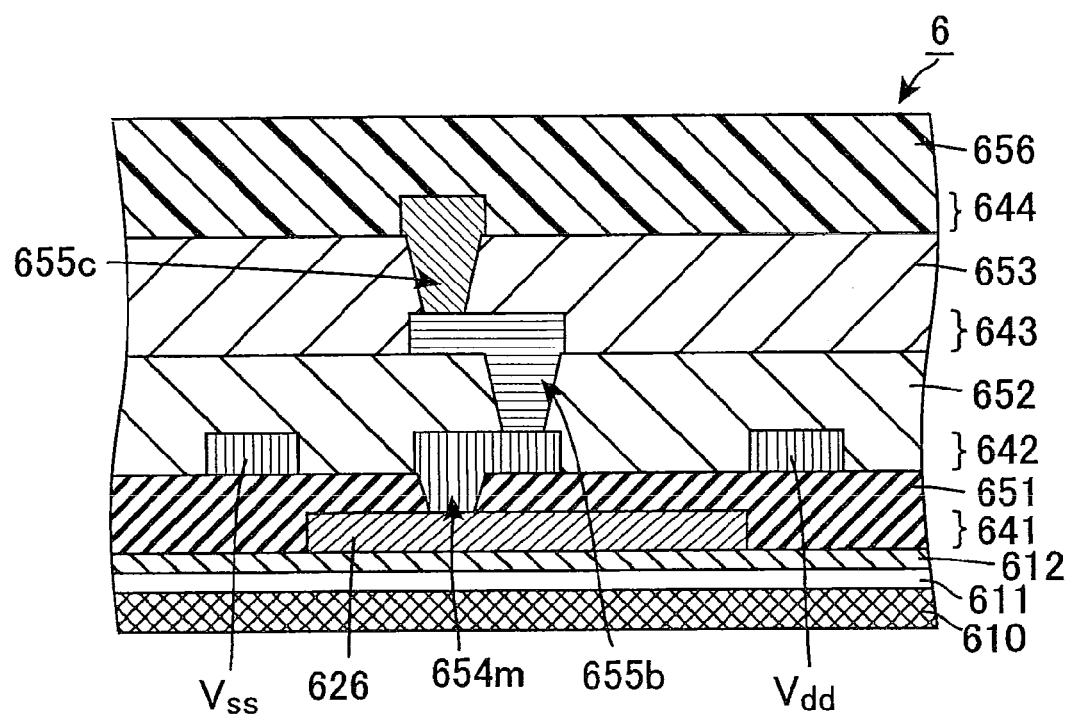
FIG. 10 is a schematic cross-sectional view showing the wiring substrate in accordance with Embodiment 6 and shows the substrate taken long line X7-Y7 in FIG. 9(a).
Figure 11:
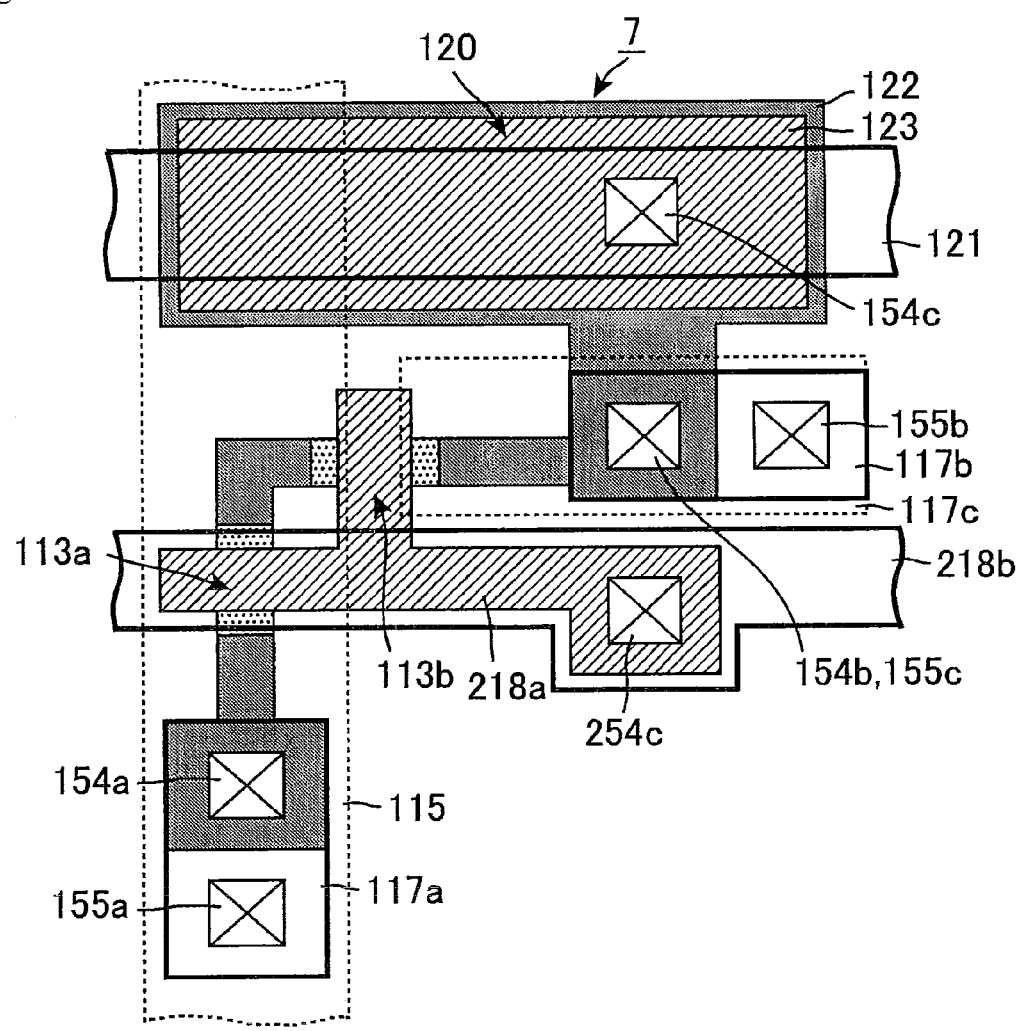
FIG. 11 is a plan view schematically showing the display device substrate in accordance with a combination of Embodiments 1 and 2.
Figure 12:
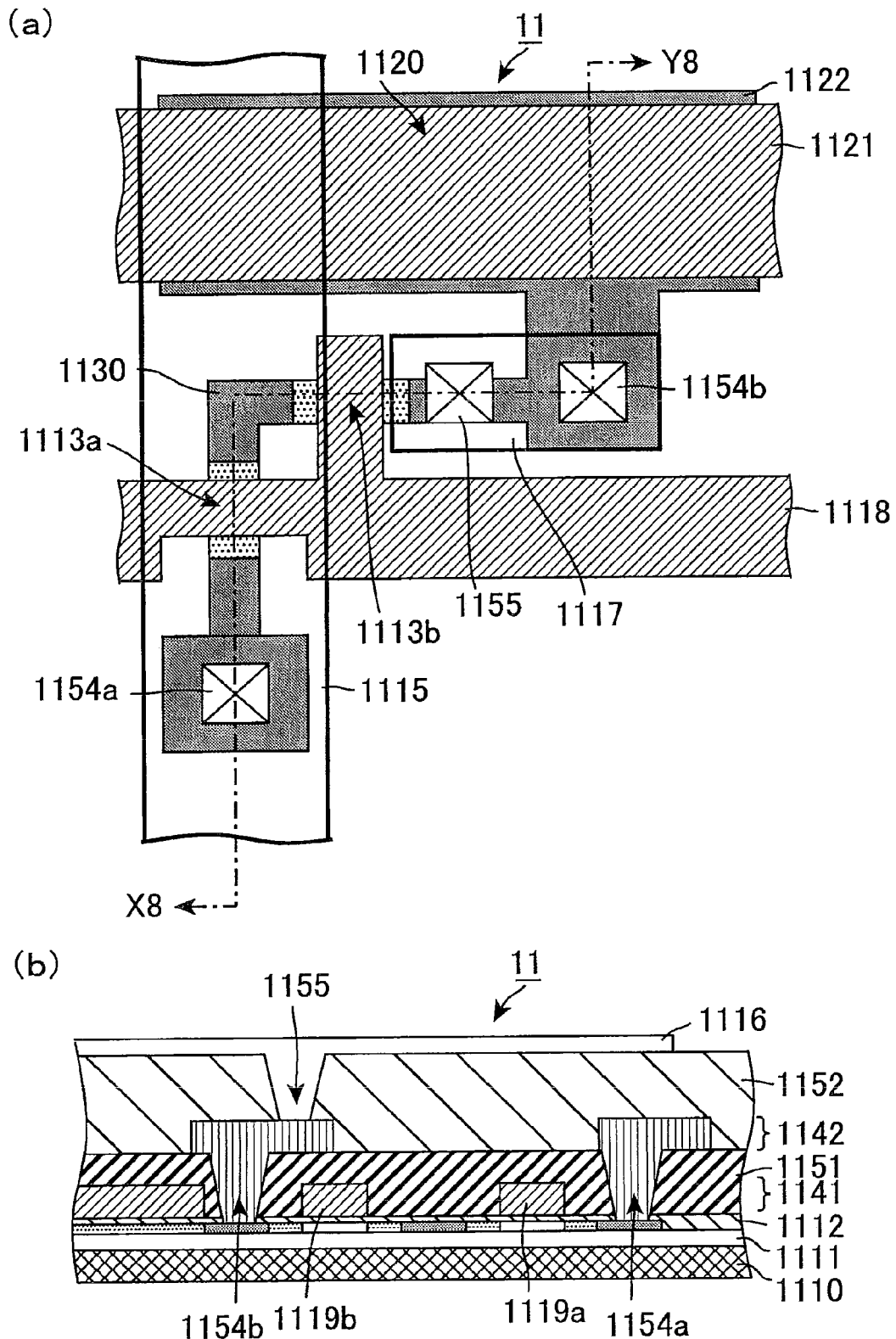
FIG. 12 is a schematic view showing a conventional display device substrate used in a liquid crystal display device.

1: Display device substrate
110, 210, 310, 410, 510, 610, 1110: Substrate
111, 211, 311, 411, 511, 611, 1111: Base layer
112, 212, 312, 412, 512, 612, 1112: Gate insulating film
113a, 113b, 213a, 213b, 313a, 313b, 413a, 413b, 513a, 513b, 613a, 613b, 1113a, 1113b, 1313a, 1313b: Pixel switching transistor
115, 215, 315a, 315b, 415, 515, 615, 1115, 1315: Data wiring
116, 216, 316, 416, 516, 616, 1116: Pixel electrode
117 to 117c, 217a to 217c, 317a to 317d, 417a, 417c, 517a to 517e, 617a to 617c, 1117: Connection part
118, 218a, 218b, 318, 418, 518, 1118, 1318: Gate wiring
119a, 119b, 219a, 219b, 319a, 319b, 419a, 419b, 519a, 519b, 619a, 619b, 1119a, 1119b, 1319a, 1319b: Gate electrode
120, 220, 320, 420, 520, 1120: Pixel data storage capacitor element
121, 221, 321, 421, 521, 1121: Storage capacitor wiring
122, 222, 322, 422, 522, 1122: Storage capacitor lower electrode
123, 223, 323, 423, 523, 1123: Storage capacitor upper electrode
130, 230, 330, 430, 530, 630a, 630b, 1130: Semiconductor layer
131a, 131b, 231a, 231b, 331a, 331b, 431a, 431b, 531a, 531b, 631a, 631b: Channel region
132a to 132e, 232a to 232d, 332a to 332e, 432a to 432d, 532a to 532d, 632a, 632b: Low concentration impurity region
133a to 133c, 233a to 233c, 333a to 333c, 433a to 433c, 533a to 533c, 633a to 633d: High concentration impurity region
141, 241, 341, 441, 541, 641, 1141: First wiring layer
142, 242, 342, 442, 542, 642, 1142: Second wiring layer
143, 243, 343, 443, 543, 643, 1143: Third wiring layer
151, 251, 351, 451, 551, 651, 1151: First interlayer insulating film
152, 252, 352, 452, 552, 652, 1152: Second interlayer insulating film
153, 253, 353, 453, 553, 653, 1153: Third interlayer insulating film
154a to 154c, 254a to 254c, 354a to 354d, 454a, 454b, 554a, 554b, 654a to 654m, 1154a, 1154b: Contact hole
155a to 155c, 255a to 255c, 355a to 355c, 455a to 455c, 555a to 555e, 655a to 655c, 1155: Through-hole
624: N-channel thin film transistor (Nch-TFT)
625: P-channel thin film transistor (Pch-TFT)
626: Gate Electrode connection part
644: Third wiring layer
654: Third interlayer insulating film
$V_{ss}$: Low-voltage power supply wiring
$V_{dd}$: High-voltage power supply wiring
$V_{in}$: Input voltage wiring
$V_{out}$: Output voltage wiring

The invention claimed is:
1. A display device substrate comprising, on a main surface of a substrate,
a structure of alternating layers of: a plurality of interlayer insulating films; and three or more wiring layers,
each of the three or more wiring layers being formed from a conductive film, wherein the display device substrate includes a data wiring, and the data wiring is positioned in a third or higher wiring layer from a side of the substrate, wherein the display device substrate includes a plurality of pixel switching transistors that are connected in series, and the plurality of pixel switching transistors overlap with the data wiring when the main surface of the substrate is viewed in plan view, wherein the plurality of pixel switching transistors include gate electrodes, respectively, the gate electrodes being positioned in a first wiring layer from the side of the substrate and arranged separately between the plurality of pixel switching transistors, the gate electrodes are connected to each other through a connection part that is positioned in a second wiring layer from the side of the substrate, and the connection part overlaps with the data wiring when the main surface of the substrate is viewed in plan view.

2. A display device comprising the display device substrate according to claim 1.

* * * * *